US008436698B2

(12) United States Patent
Rogers

(10) Patent No.: US 8,436,698 B2
(45) Date of Patent: *May 7, 2013

(54) MEMS-BASED TUNABLE FILTER

(75) Inventor: John E. Rogers, Vero Beach, FL (US)

(73) Assignee: Harris Corporation, Melbourne, FL (US)

( * ) Notice: Subject to any disclaimer, the term of this patent is extended or adjusted under 35 U.S.C. 154(b) by 629 days.

This patent is subject to a terminal disclaimer.

(21) Appl. No.: 12/610,735

(22) Filed: Nov. 2, 2009

(65) Prior Publication Data

US 2011/0102105 A1    May 5, 2011

(51) Int. Cl.
*H03H 9/46* (2006.01)
*H03H 9/125* (2006.01)
*H03H 7/01* (2006.01)
*H03H 7/075* (2006.01)
*H03H 3/00* (2006.01)
*H02N 2/02* (2006.01)
*H01L 21/02* (2006.01)
*H01L 29/93* (2006.01)

(52) U.S. Cl.
USPC ........... 333/186; 333/174; 333/185; 310/309; 257/312; 257/532; 257/595; 438/381; 438/386

(58) Field of Classification Search .................. 333/167, 333/174, 185, 186; 310/309; 257/307, 532, 257/595, 312; 438/381, 386, 393
See application file for complete search history.

(56) References Cited

U.S. PATENT DOCUMENTS

| 5,025,346 A | 6/1991 | Tang et al. |
| 5,959,516 A | 9/1999 | Chang et al. |
| 6,133,670 A | 10/2000 | Rodgers et al. |
| 6,360,033 B1 | 3/2002 | Lee et al. |
| 6,404,304 B1 | 6/2002 | Kwon et al. |
| 6,497,141 B1 | 12/2002 | Turner et al. |
| 6,621,390 B2 | 9/2003 | Song et al. |
| 6,661,069 B1 | 12/2003 | Chinthakindi et al. |
| 6,784,766 B2 | 8/2004 | Allison et al. |
| 6,798,315 B2 | 9/2004 | Schaefer |
| 6,853,534 B2 * | 2/2005 | Williams ...................... 361/277 |
| 6,975,193 B2 * | 12/2005 | Knieser et al. .................. 335/78 |

(Continued)

FOREIGN PATENT DOCUMENTS

| EP | 1 785 391 A2 | 5/2007 |
| WO | WO-03055061 A1 | 7/2003 |
| WO | 2008123525 A1 | 10/2008 |

OTHER PUBLICATIONS

A.D. Yalcinkaya et al.; "Low Voltage, High-Q SOI MEMS Varactors for RF Applications"; 2003 IEEE Proceedings of the 29th European Solid-State Circuits Conference, ESSCIRC '03, Sep. 16-18, 2003, pp. 607-610, with one IEEE Xplore abstract page.*

(Continued)

*Primary Examiner* — Barbara Summons
(74) *Attorney, Agent, or Firm* — Fox Rothschild, LLP; Robert J. Sacco

(57) ABSTRACT

A filter device is provided including a substrate (302) and a plurality of horizontal gap closing actuator (GCA) devices (550) disposed on a first surface of the substrate. The plurality of GCA devices includes and one or more GCA varactors (700). Each one of the plurality of horizontal GCA devices includes at least one drive comb structure (602a, 602b, 702a, 702b), at least one input/output (I/O) comb structure (616a, 676b, 716a, 716b), and at least one truss comb structure (604, 704) interdigitating the drive comb and the I/O comb structures. The truss comb structure is configured to move along a motion axis between at least a first interdigitated position and a second interdigitated position based on a bias voltage applied between the truss comb structure and the drive comb structure.

20 Claims, 13 Drawing Sheets

U.S. PATENT DOCUMENTS

| | | | |
|---|---|---|---|
| 6,977,569 | B2 | 12/2005 | Deligianni et al. |
| 7,091,647 | B2 | 8/2006 | Jerman |
| 7,251,466 | B2 * | 7/2007 | Porret et al. ............. 455/190.1 |
| 7,304,556 | B2 | 12/2007 | Tamura et al. |
| 7,598,836 | B2 * | 10/2009 | Lee ............................ 336/147 |
| 7,732,975 | B1 | 6/2010 | Hobbs et al. |
| 7,933,112 | B2 * | 4/2011 | Ayazi et al. ................... 361/287 |
| 7,977,136 | B2 * | 7/2011 | Ayazi et al. ..................... 438/48 |
| 8,039,922 | B2 * | 10/2011 | Ni ................................. 257/532 |
| 2002/0130586 | A1 | 9/2002 | Mao et al. |
| 2003/0184413 | A1 * | 10/2003 | Nguyen ........................ 333/186 |
| 2005/0073380 | A1 | 4/2005 | Howell et al. |
| 2005/0088255 | A1 * | 4/2005 | Sengupta et al. ............ 333/174 |
| 2006/0003482 | A1 | 1/2006 | Chinthakindi et al. |
| 2006/0261702 | A1 | 11/2006 | Harada et al. |
| 2008/0157627 | A1 | 7/2008 | Kato et al. |
| 2009/0002915 | A1 | 1/2009 | Ayazi et al. |
| 2010/0091372 | A1 | 4/2010 | Yamanoi et al. |
| 2011/0198202 | A1 * | 8/2011 | Rogers .......................... 200/181 |

OTHER PUBLICATIONS

G.K. Fedder et al.; "Tunable RF and Analog Circuits Using On-Chip MEMS Passive Components"; 2005 IEEE International Solid-State Circuits Conference, ISSCC 2005, Feb. 9, 2005, Digest of Technical Papers, pp. 390-391.*

U.S. Appl. No. 12/699,118, filed Feb. 3, 2010, entitled "High Accuracy MEMS-Based Varactors".

U.S. Appl. No. 12/708,265, filed Feb. 18, 2010, entitled "MEMS-Based Ultra-Low Power Devices".

Tas N.R., et al.: "Technical Note; Design, Fabrication and Test of Laterally Driven Electrostatic Motors Employing Walking Motion and Mechanical Leverage", Journal of Micromechanics & Microengineering, Institute of Physics Publishing, Bristol, GB, vol. 13, No. 1, Jan. 1, 2003, pp. N6-N15, XP020068883.

Harris Corporation, International Search Report dated Mar. 16, 2011; Application Serial No. PCT/US2010/054889.

Rogers, John E., et al., "Bi-Directional Gap Closing MEMS Actuator Using Timing and Control Techniques," IEEE Industrial Electronics, IECON 2006—32nd Annual Conference, Publication Date: Nov. 6-10, 2006; pp. 3149-3154.

International Search Report mailed Oct. 7, 2011 in Application Serial No. PCT/US2011/022483 in the name of Harris Corporation.

International Search Report mailed Mar. 5, 2012; Application Serial No. PCT/US2011/023321, in the name of Harris Corporation.

* cited by examiner

200

400

500

600

700

800

900

1000

1100

1200

1300

MEMS-BASED TUNABLE FILTER

FIELD OF THE INVENTION

The present invention relates to tunable filters and methods for forming the same, and more specifically to micro-electromechanical system (MEMS) tunable filters.

BACKGROUND

Filtering of signals over a large range of frequencies is typically accomplished by providing a bank of filters. Some types of conventional filter banks for radio frequency (RF) communications are formed by combining discrete inductors and capacitors using surface mount and/or through hole technologies. However, the use of such discrete components generally requires a large number of components to cover a large range of frequencies. As a result, the surface area required for a multi-band filter using discrete components is typically large. Other types of filter banks are formed using miniature or micro-miniature filters. Although a bank of such filters can cover a wide range of frequencies, the filters generally consume a large amount of power (>1 W per filter). Additionally, such filters have a total linear length (i.e., width+length+height) that is typically greater than 1 inch. As a result, filter banks constructed using such filters are also relatively large, limiting their applicability to portable and other smaller sized devices.

SUMMARY

Embodiments of the invention provide methods for fabricating micro-electro-mechanical system (MEMS) tunable filter devices and devices therefrom. In a first embodiment of the invention, a filter device is provided, including a substrate and a plurality of horizontal gap closing actuator (GCA) devices disposed on a first surface of the substrate. The plurality of GCA devices includes one or more GCA varactors, where each one of the plurality of horizontal GCA devices includes at least one drive comb structure, at least one input/output (I/O) comb structure, and at least one truss comb structure interdigitating the drive comb and the I/O comb structures. In the device, the truss comb structure is configured to move along a motion axis between at least a first interdigitated position and a second interdigitated position based on a bias voltage applied between the truss comb structure and the drive comb structure.

In a second embodiment of the invention, a filter bank is provided, including a substrate and one or more filter elements coupled to a common input node and a common output node. In the filter bank each of the filter elements includes a plurality of horizontal gap closing actuator (GCA) devices disposed on a first surface of the substrate, where the plurality of GCA devices includes one or more GCA varactors. Each one of the plurality of horizontal GCA devices includes at least one drive comb structure, at least one input/output (I/O) comb structure, and at least one truss comb structure interdigitating the drive comb and the I/O comb structures. In the filter bank, the truss comb structure is configured to move along a motion axis between at least a first interdigitated position and a second interdigitated position based on a bias voltage applied between the truss comb structure and the drive comb structure.

In a third embodiment of the invention, a method of manufacturing a filter device is provided. The method includes the step of providing a substrate includes a stack of layers, the stack includes at least one base layer, at least one release layer on the base layer, and at least one structure layer on the release layer. The method also includes the step of depositing at least one electrically conductive layer on the structure layer. The method further includes the step of forming a plurality of voids in the electrically conductive layer, the structure layer, and the release layer. In the method, the plurality of voids define a plurality of patterned regions, the plurality of patterned regions defining a plurality of horizontal gap closing actuator (GCA) devices includes one or more GCA varactors, where each of the plurality of GCA devices includes at least one drive comb structure, at least one input/output (I/O) comb structure, and at least one truss comb structure interdigitating the drive comb and the I/O comb structures. In the method, the plurality of voids in the release layer extend beneath the truss comb structure to allow the truss comb structure to move along a motion axis between at least a first interdigitated position and a second interdigitated position.

DETAILED DESCRIPTION

Figure 1:
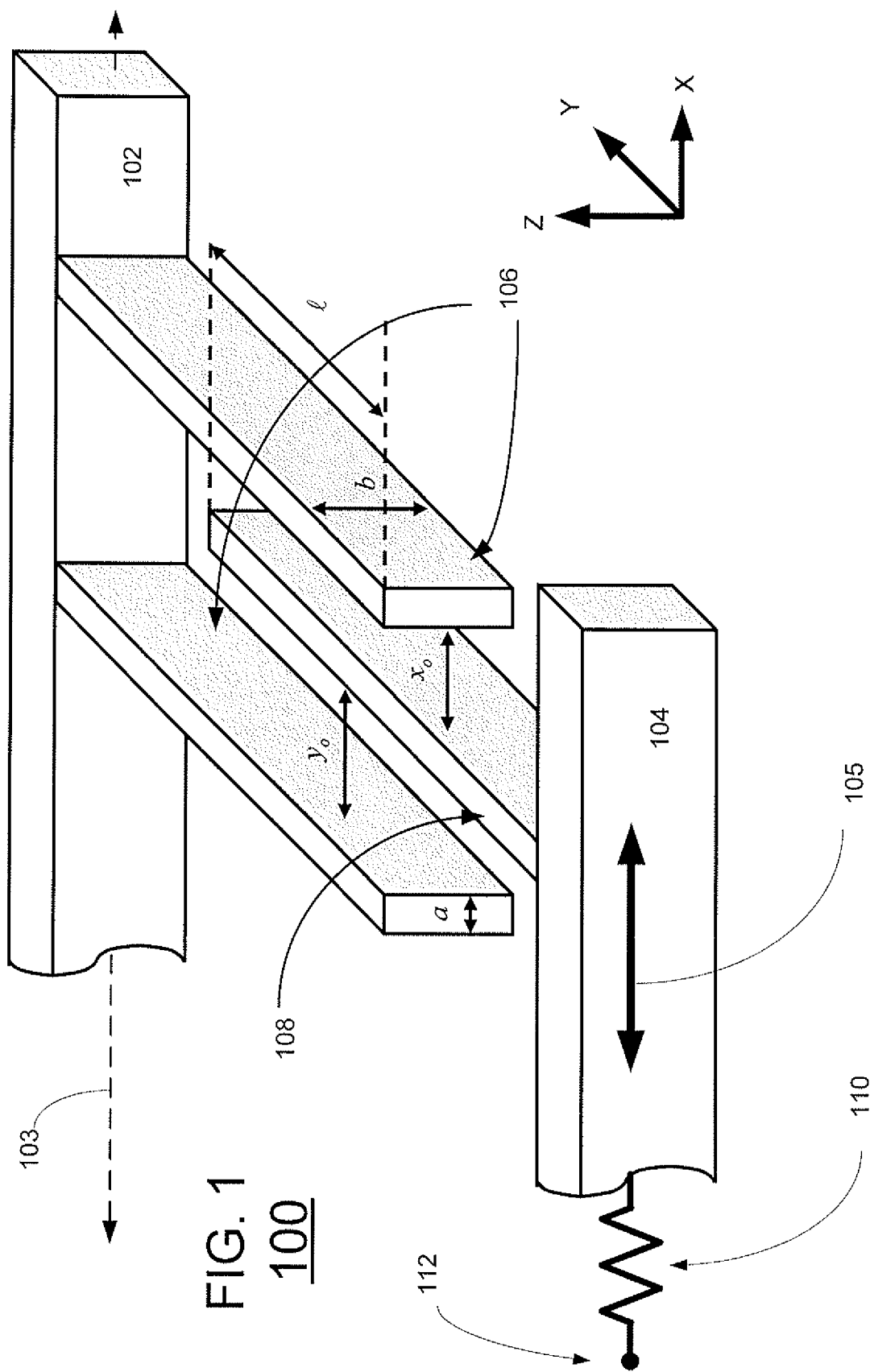
FIG. 1 shows a drive portion of a MEMS horizontal device in accordance with an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As described above, the main limitations of conventional filter banks concern size and power. In order to reduce size and power requirements, filter banks fabricated using integrated circuit (IC) or micro-electro-mechanical system (MEMS) technologies have been proposed. However, such approaches generally result in relatively complex devices. For example, in the case of IC-based filter banks, the capacitor components are typically provided using discrete capacitor elements formed in the IC and having a fixed capacitance. Therefore, to selectably filter over a wide range of frequencies, a large number of such capacitors are needed and a switching system is also needed to select between the capacitors. As a result, IC-based filter banks have relatively complex designs. In the case of conventional MEMS-based filter banks, MEMS capacitors can be used to provide capacitors with an adjustable capacitance, limiting the number of capacitors required. However, such devices are typically complex to produce. For example, a basic MEMS-based filter bank will require at least three levels of devices: (1) MEMS levels to form the adjustable capacitors, (2) thick metal levels to form any necessary inductors, and (3) IC device levels to provide interconnects and switches for directing signals. In some cases, MEMS-type switches can be provided at the MEMS level in order to eliminate the IC device level. However, conventional MEMS-based switches and conventional MEMS-based capacitors generally have significantly different geometries, requiring more complex processes and designs to successfully form both types of devices on the same substrate. This typically results in manufacturing techniques with smaller process margins, increasing overall development and manufacturing costs.

Embodiments of the invention provide systems and methods for providing filter banks using MEMS components with common geometries to reduce overall complexity and costs of filter bank devices. In particular, the various embodiments of the invention utilize MEMS horizontal gap closing actuator (GCA) devices with common geometries to form both the switches and adjustable capacitors for a filter bank. Such MEMS devices can be used with or without a thick metal inductor level to form a variety of filter types, including low pass, high pass, band pass, and band stop filters.

As used herein with respect to MEMS devices, the term "horizontal GCA device" refers to a GCA MEMS device in which actuation and interaction of the components in the MEMS device is limited to directions parallel to the supporting substrate. That is, actuation of the horizontal GCA device results in a substantially lateral motion. Consequently, the horizontal MEMS devices for a filter or filter bank can be fabricated with one or two masks rather than the multiple masks (>2) typically required for conventional IC or MEMS filter devices. This reduces the overall complexity for designing and manufacturing filter banks. Furthermore, horizontal MEMS GCA devices in accordance with the various embodiments of the invention can be easily modified to provide various types of devices, such as switches and adjustable capacitors (i.e., varactors), without significantly affecting operation or manufacture of such devices. The operation and manufacture of such horizontal GCA devices is described below with respect to FIGS. 1, 2, and 3A-3C.

FIG. 1 shows a drive portion 100 of a MEMS horizontal GCA device in accordance with an embodiment of the invention. Drive portion 100 includes a drive comb structure 102 having a fixed position and extending along a longitudinal axis 103. Drive portion 100 also includes a truss comb structure 104 that extends substantially parallel to axis 103 and that can elastically move along the X direction along a motion axis 105 substantially parallel to axis 103 of drive comb structure 102. For example, as shown in FIG. 1, truss comb structure 104 can include or be attached to at least one restorative or elastic component 110 connected to a fixed end 112. The elastic component 110 restores a position of truss comb structure 104 when no external forces are being applied. The drive comb structure 102 can have one or more drive fingers 106 extending therefrom towards truss comb structure 104. The truss comb structure 104 can similarly include one or more truss fingers 108 extending therefrom towards drive comb structure 102.

As shown in FIG. 1, the drive comb structure 102 and the truss comb structure 104 can be positioned to be interdigitating. The term "interdigitating", as used herein with respect to comb structures, refers to arranging comb structure such that the fingers extending from such comb structures at least partially overlap and are substantially parallel.

In the embodiment shown in FIG. 1, fingers 106 and 108 each have a width and a height of a and b, respectively, and overlap of 1. Although comb structures with multiple sets of fingers can be configured to have the same dimensional relationships (width, height, and overlap) the invention is not limited in this regard and dimensional relationships can vary, even within a single GCA device. Furthermore, the portion shown in FIG. 1 and the dimensional relationship shown in FIG. 1 are only the electrically conductive portions of drive portion 100. As one of ordinary skill in the art will recognize, comb structures can further include structural portions comprising non-conductive or semi-conductive materials extending in the Z direction to provide structural support for the conductive portions shown in FIG. 1. Such structures are more fully described below with respect to FIG. 3.

The drive portion 100 shown in FIG. 1 operates on the principle of electrostatic attraction between adjacent interdigitating fingers. That is, motion of the truss comb structure 104 can be generated by developing a voltage difference between the drive comb structure 102 and the truss comb structure 104. In the case of device 100, the voltages applied at comb structures 102 and 104 are also seen at fingers 106 and 108, respectively. The resulting voltage difference generates an attractive force between fingers 106 and fingers 108. If the generated electrostatic force between fingers 106 and finger 108 is sufficiently large to overcome the other forces operating on truss comb structure 104 (such as a spring constant of elastic component 110), the electrostatic force will cause the motion of the truss comb structure 104 between a first interdigitated position (resting position at a zero voltage difference) and a second interdigitated position (position at a non-zero voltage difference) among motion axis 105. Once the voltage difference is reduced to zero, elastic component 110 restores the position of truss comb structure 104 to the first interdigitating position.

As shown in FIG. 1, each finger 108 in truss comb structure 104 can be disposed between two fingers 106 of drive comb structure 102. Accordingly, an electrostatic force is generated on both sides of finger 108 when a voltage difference is developed between comb structures 102 and 104. Therefore, to ensure movement of truss comb structure 104 in only one direction in response to a voltage difference, fingers 108 are positioned with respect to fingers 106 such that the electrostatic force in the a first direction along the X-axis is greater than the electrostatic force in an opposite direction in the X-axis. This is accomplished by configuring the finger spacing (i.e., spacing between fingers of interdigitated comb structures) in the first direction along the X-axis ($x_0$) and the finger spacing in the opposite direction along the X-axis ($y_0$) to be different when the voltage difference is zero. Since the amount of electrostatic force is inversely proportional to the distance between fingers, the motion of truss comb structure will be in the direction associated with the smaller of $x_0$ and $y_0$. In the exemplary embodiments of the invention described below, $x_0$ will be used to identify the smaller of $x_0$ and $y_0$ The drive portion illustrated in FIG. 1 provides a control mechanism for horizontal actuation in a MEMS device that can be precisely controlled by adjusting the voltage difference between the drive and truss comb structures. This allows the same general configuration to be used for both switching between two positions (by alternating between a first and second voltage difference) and for adjusting continuously over a range of interdigitating positions (by adjusting the voltage continuously over a voltage range). Consequently, the drive portion in FIG. 1 can be used for toggling devices or for operating adjustable devices.

Although the drive portion described above could be coupled to any variety of devices, using such a drive portion for various types of devices will only provide a partial improvement in manufacturing robustness and device reliability. In general, the robustness of the IC fabrication techniques used for fabricating MEMS and other types of devices is increased by reducing the variety of feature types and dimensional variation in each layer. The various embodiments of the invention exploit this characteristic. In particular, another aspect of the invention is to use the comb structure drive portion in conjunction with a comb structure based reactive portion to provide device functionality for a filter. Therefore, in the various embodiments of the invention, one structure can be used to provide a variety of devices is shown below in FIG. 2.

Figure 2:
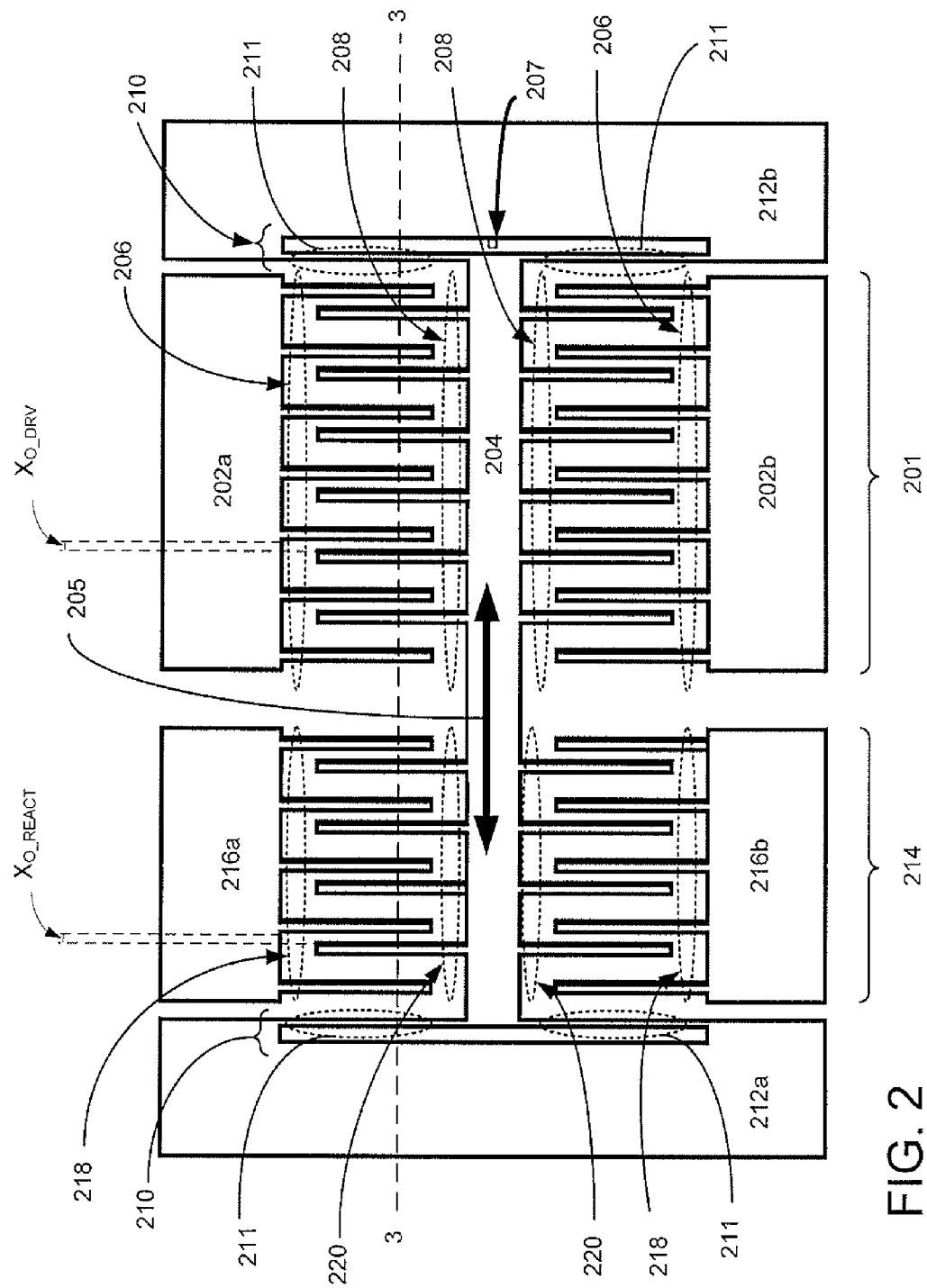
FIG. 2 shows a top-down view of an exemplary MEMS comb device which can be adapted for use as one or more types of devices in a filter bank in accordance with an embodiment of the invention.

FIG. 2 shows a top-down view of an exemplary MEMS comb device 200 which can be adapted for use as one or more types of devices in a filter bank in accordance with an embodiment of the invention. As shown in FIG. 2, device 200 includes a drive portion 201, similar to the drive portion 100 described above with respect to FIG. 1. That is, drive portion 201 includes a drive comb structures 202a and 202b (collectively 202), a truss comb structure 204, drive fingers 206, and truss fingers 208.

Truss comb structure 204 also includes elastic portions 210 with fixed ends 212a and 212b (collectively 212). In the exemplary embodiment shown in FIG. 2, elastic portions 210 comprise elastic or flexible reed structures 211 mechanically coupling truss comb structure 204 to fixed ends 212. Therefore, a leaf spring structure is effective formed on the two ends of truss comb structure. In operation, as a force is exerted on truss comb structure 204 (by generating a voltage difference between fingers 206 and 208, the reed structures 211 deform to allow truss comb structure to move along motion axis 205 from a first interdigitated position to at least a second interdigitated position. Once the force is no longer being exerted, the reed structures 211 apply a restorative force to restore the position of the truss comb structure 204 to a first interdigitated position. The operation and configuration of components 202-212 is substantially similar to that of components 102-112 in FIG. 1. Therefore the discussion in FIG. 1 is sufficient for describing the operation and configuration for components 202-210 in FIG. 2.

As described above, in addition to the drive portion 201, MEMS horizontal GCA devices in accordance with the various embodiments of the invention also provide a reactive portion 214, as shown in FIG. 2. The reactive portion 214 includes input/output comb structures 216a and 216b (collectively 216) having a fixed position. The input/output comb structures 216 can also have one or more sense fingers 218 extending therefrom. To interact with reactive portion 214, the truss comb structure 204 can additionally include one or more additional truss fingers 220 extending therefrom and interdigitating sense fingers 218. Therefore, the truss comb structure 204 interdigitates (via fingers 208 and fingers 220) both the drive fingers 206 and the sense fingers 218. As a result, the truss comb structure 204 couples and is part of both the drive portion 201 and reactive portion 214.

In the various embodiments of the invention, motion of truss comb structure 204 along motion axis 205 will result in the spacing between fingers 206 and 208 and between fingers 218 and 220 to change together. Thus, adjustment of the spacing between fingers 206 and 208 using a bias voltage can be used to control the spacing between fingers 218 and 220.

In the embodiment shown in FIG. 2, fingers 206, 208, 218, and 220 are shown to be similarly dimensioned and having a same amount of overlap. Although, device 200 can be configured to include comb structures having multiple sets of fingers that have the same dimensional relationships in both the drive portions and the reactive portions, the invention is not limited in this regard and dimensional relationships can be different in the drive portions and reactive portions. Furthermore, the dimensional relationship can also vary within the reactive portion. Additionally, as described above with respect to FIG. 1, the comb structures 202, 204, and 216 can further include conductive portions and structural portions, comprising non-conductive or semi-conductive materials, to provide structure support for the conductive portions. The relationship between these portions will be described below in greater detail with respect to FIG. 3.

As described above, motion of truss comb structure 204 along motion axis 205 is generated by developing a voltage difference in drive portion 201. In particular, by developing a voltage difference between across fingers 206 and 208 by apply a voltage across drive comb structures 202 and truss comb structure 204. The voltage difference causes the finger spacing ($x_{0\_DRV}$) between fingers 206 and 208 to vary, which is translated into motion of truss comb structure 204 along motion axis 205. The result of this motion of the truss comb structure 204 is the motion of fingers 220 with respect to fingers 218. Accordingly, based on the voltage difference between drive comb structures 202 and truss comb structure 204, the finger spacing between fingers 218 and 220 ($x_{0\_REACT}$) can be varied. In some embodiments of the invention, a stopper 207 can be used to limit the amount of motion of truss comb structure 204 and prevent either $x_{0\_REACT}$ and/or $x_{0\_DRV}$ from going to zero.

Figure 3A:
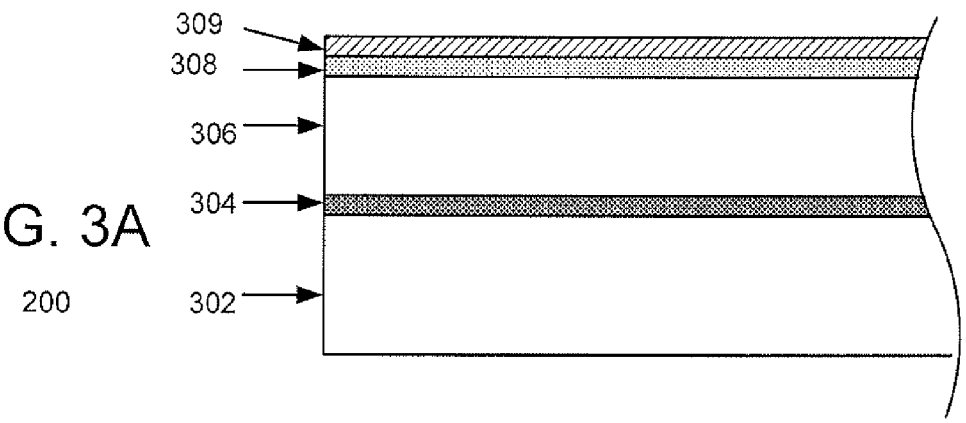
FIGS. 3A-3C show partial cross-sections of the device in FIG. 2 through cutline 3-3 during various steps of a fabrication process in accordance with the various embodiments of the invention.
Figure 3B:
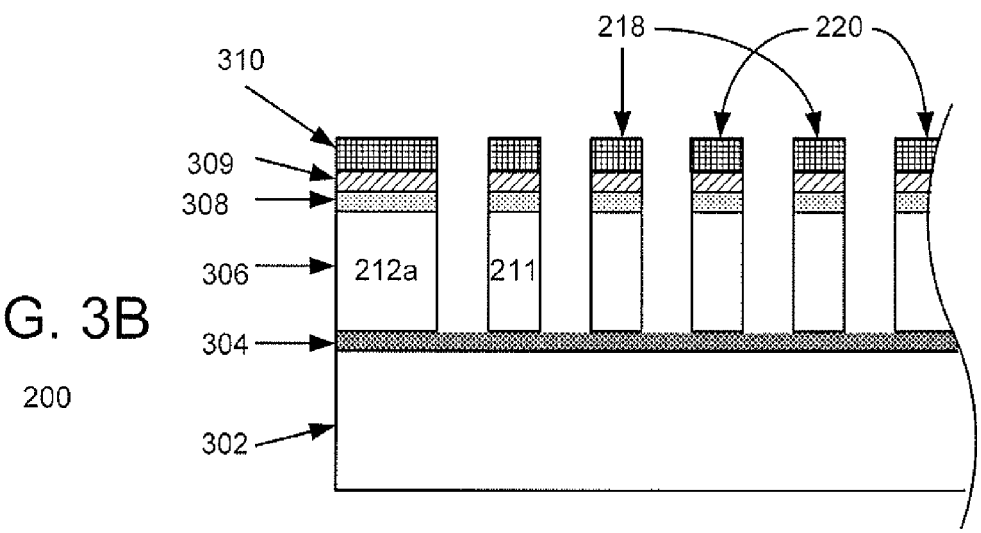
Figure 3C:
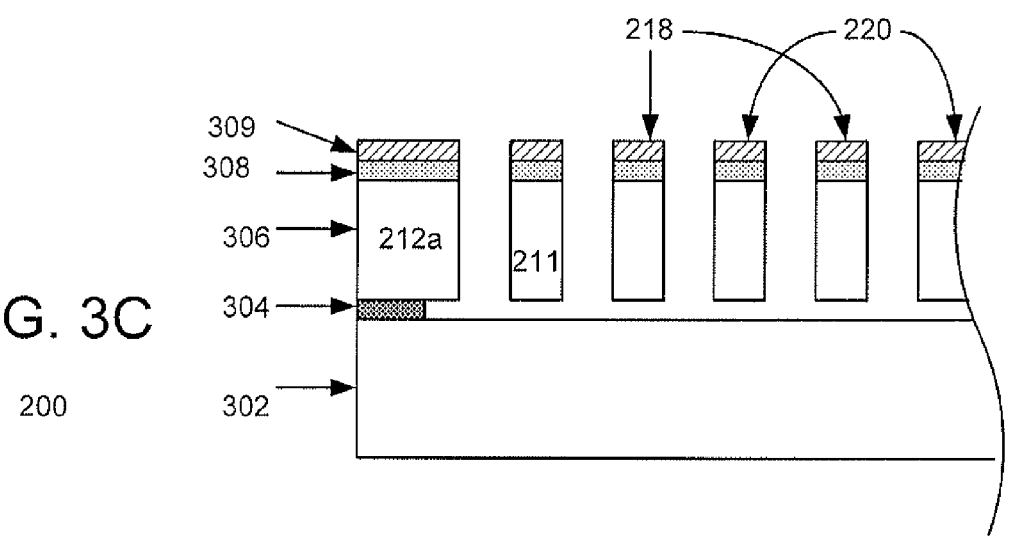

The structure shown in FIG. 2 can be fabricated using various IC and/or MEMS fabrication techniques. This is illustrated in FIGS. 3A-3C. FIGS. 3A-3C show partial cross-sections of device 200 through cutline 3-3 in FIG. 2 during various steps of a fabrication process in accordance with the various embodiments of the invention.

Manufacture of device 200 begins with the formation of the various layers used to form the structures in FIG. 2. As shown in FIG. 3A, this includes at least one base layer 302, at least one release layer 304 formed on base layer 302, at least one structural layer 306 formed on release layer 304, a lower conductive layer 308, and an upper conductive layer 309 formed on structural layer 306. The upper conductive layers 309 can one or more metal layers. The lower conductive layers 308 can comprise one or more adhesion layers to improve adhesion between upper conductive layers 309 and structural layer 306. However, in some embodiments, lower conductive layers 308 can be omitted. The materials for layers 304-309 can be formed on base layer 302 in a variety of ways, including thermal oxidation, physical/chemical deposition, sputtering, and/or electroplating processes, depending on the type and composition of the layer being formed.

In the various embodiments of the invention, the composition of structural layer 306 is selected such that it is electrically non-conductive. Furthermore, the composition of release layer 304 is selected such that it can be selectively removable, with respect to base layer 302, structural layer 306, and conductive layers 308, 309, using at least one removal process. For example, in some embodiments of the invention, layers 302-306 are provided by using a silicon on insulator (SOI) substrate. In such a substrate, the silicon oxide comprising layer sandwiched between two layers of silicon provides release layer 304 between the silicon-comprising base layer 302 and structural layer 306. One of ordinary skill in the art will recognize that various types of etch processes are readily available for removing silicon oxide comprising materials without substantially removing silicon comprising materials. However, the invention is not limited to SOI substrates. In other embodiments of the invention, the release layer 304 and structural layer 306 are formed on a silicon substrate that provides base layer 302. In still other embodiments, non-silicon comprising materials are used for forming layers 302-306.

Once layers 302-309 are formed, formation of the structures for device 200 can begin. In general, the structures shown in FIG. 3B for device 200 are formed by creating voids in conducting layers 308, 309, structural layer 306, and release layer 304. This step can be performed in a variety of ways. For example, as shown in FIG. 3B, a masking layer 310 can be formed on layer 309, having a mask pattern in accordance with the structures in device 200. For example, the portion of masking layer 310 shown in FIG. 3B shows the mask pattern for portions of reed structure 211, fixed end 212a, fingers 218, and fingers 220. Once the mask pattern is formed in masking layer 310, various dry and/or wet etching processes are used to transfer the mask pattern into conducting layers 308, 309 and structural layer 306.

Although the exemplary mask pattern shown in FIG. 3B provides for the same pattern to be transferred into both conducting layers 308, 309 and structural layer 306, the various embodiments of the invention are not limited in this regard. In some embodiments of the invention, two masking steps are performed. For example, a first mask pattern can be provided for etching conducting layers 308. Afterwards a second mask pattern is provided for etching structural layer 306. The use of such different patterns will be described below with respect to FIGS. 5 and 6.

Once the masking pattern has been transferred into structural layer 306, portions of release layer 304 are removed to "release" at least some portions of truss comb structure 204. This can be accomplished by providing an isotropic selective removal process to device 200. An isotropic process not only removes the exposed portions of release layer 304, but will also removes portions of release layer 304 (i.e., creates voids) beneath structural layer 306 in the vicinity of openings in structural layer 306 (i.e., undercut these structures). If the lateral dimensions of features in structural layer 304 are small enough (such as under reed structures 211, fingers 218, and fingers 220 shown in FIGS. 3A-C), all portions of the release layer 304 underneath such features will be removed. This process thus leaves such features free-standing or "released". These features will then only remain connected to other portions of device 200 via connections in other layers. For example, as shown in FIG. 3C, the portions of release layer 304 underneath portions of structural layer 306 associated with reed structures 211, fingers 218, and fingers 220 are removed. Still these features are attached to device 200 via other portions of structural layer 306 and/or conductive layers 308, as shown in FIG. 2. In one exemplary configuration, such structures can be realized by utilizing an SOI substrate and a hydrofluoric (HF) acid-based etch. First an etch process is used to form the voids shown in FIG. 3B. Afterwards, an HF acid-based etch process is used to selectively remove and undercut portions of the silicon oxide comprising layer, creating voids beneath selected features of device 200, to result in the structure shown in FIG. 3C.

The various embodiments of the invention are not limited to the exemplary manufacturing process described above. For example, in some embodiments of the invention, atomic layer epitaxial (ALE) processes are used to form conductive layers 308, 309 after etching of structural layer 306 and removal of release layer 304. In such embodiments, use of ALE process allows precise control of placement and thickness of conductive layer. As a result, device control can be improved since the dimensions of the active portions of the horizontal GCA device can be constructed with higher precision.

In some embodiments, the MEMS devices described above are combined with other structures, such as inductor structures or ground plane layers, to provide various types of the filter structures. However, such structures can require some additional processing steps. These additional process steps are conceptually described with respect to FIGS. 4 and 5.

Figure 4:
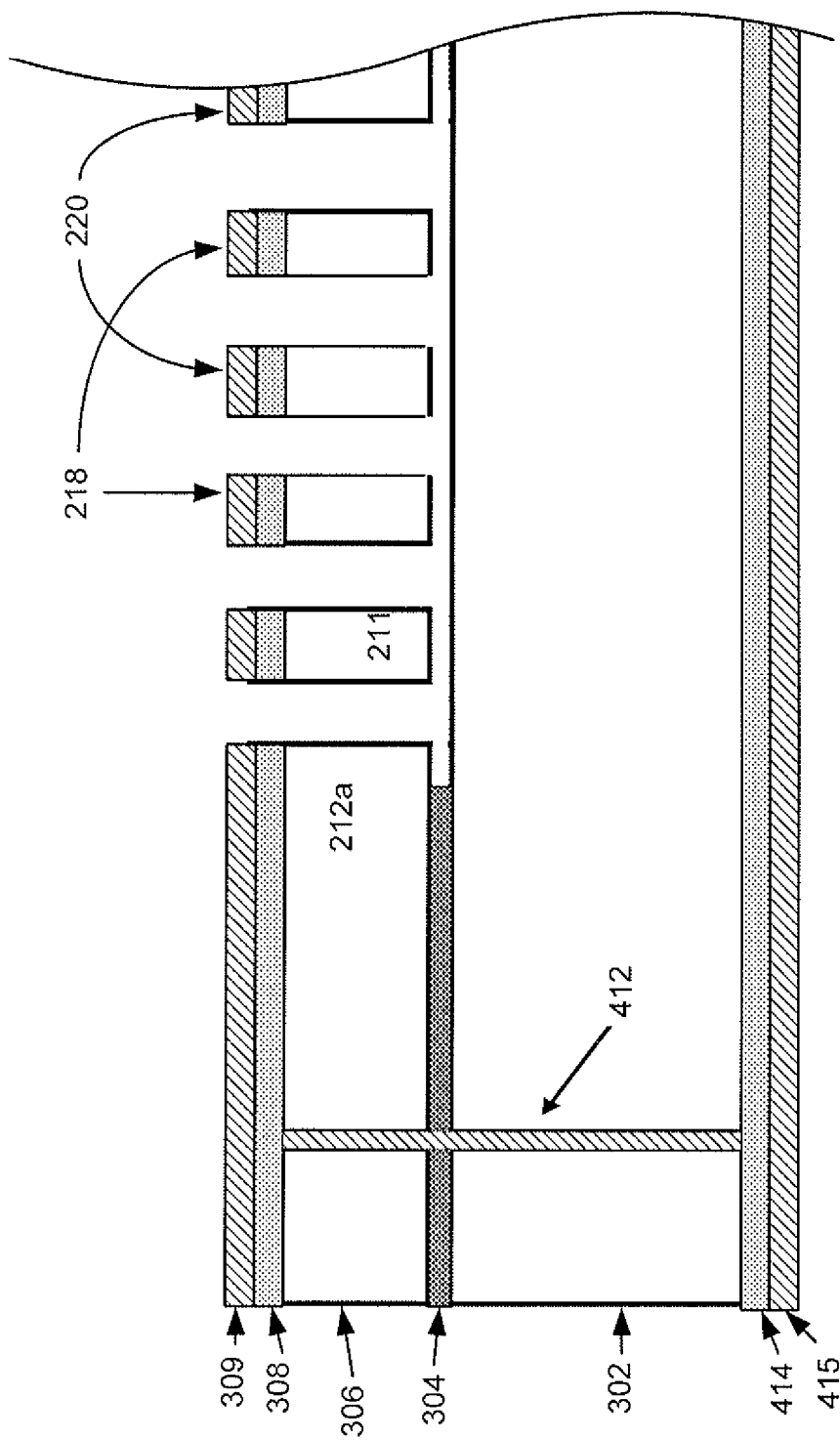
FIG. 4 shows a cross-section of a filter device in accordance with an embodiment of the invention.

FIG. 4 shows a cross-section of a filter device 400 in accordance with an embodiment of the invention. Like device 200 in FIG. 3, device 400 also includes at least one base layer 302, at least one release layer 304 formed on base layer 302, at least one structural layer 306 formed on release layer 304, and conductive layers 308, 309 formed on structural layer 306. Accordingly, the description of the operation and manufacture of device 200 above with respect to FIGS. 2 and 3 and is sufficient for purposes of describing layers 302-309 and the overall operation of the resulting device 400.

As described below, some filter configurations can require that one or more of the structures in device 200 (such as fixed ends 212) be coupled to ground or some other reference voltage. Although additional wiring can be formed in the conductive layers 308, such additional wiring can require additional surface area, increasing the overall size of device 200. Accordingly, in some embodiments of the invention, vias can be used to couple such features to a ground plane layer on an opposite side of the device. For example, as shown in FIG. 4, a via 412 is used to couple conductive layers 308, 309 to conductive layers 414, 415 on an opposing side of base layer 302.

In such embodiments, prior to formation of conductive layers 308, 309, an opening is etched through base layer 302, release layer 304, and structural layer 306. The opening is then filled, at least partially, with an electrically conductive material to provide an electrically conductive channel connecting an upper surface of structural layer 306 and a bottom surface of base layer 302. Various processes can be used to form such vias. For example, in the case of SOI substrate, through-silicon via processes can be used to form vias 412. Conductive layers 308, 309 are then formed and formation of device 400 can proceed as previously described for device 200 in FIGS. 3A-3C. Afterwards, the vias can be coupled to a common ground plane by forming conductive layers 414, 415 on the bottom of base layer 302 and over vias 412. The conductive layers 414, 415 can comprise one or more adhesion layers 414 formed directly on the bottom of base layer 302 and one or more metal layers 415. However, in some embodiments, adhesion layers 414 can be omitted.

The configuration in FIG. 4 can also be used to form filters including inductive elements. For example, in some embodiments, the conductive layers 308, 309 and/or the conductive layers 414, 415 can be patterned to form shorted stub inductor elements in conjunction with a via 412. A "shorted stub inductor", as used herein, refers to an elongated electrically conductive stub feature or element having a first end connected to a signal path and a second end connected to the ground plane, where the inductance is the inherent inductance of the conductive element determined based on its length. In such embodiments, the stub feature can be formed using the conductive layers 308, 309 and/or the conductive layers 414. The stub feature can then be shorted to ground using via 412.

However, the various embodiments of the invention are not limited to solely the use of shorted stub inductor elements. In other embodiments of the invention, discrete inductor elements can also be formed using one or more additional layers, as illustrated in FIG. 5.

Figure 5:
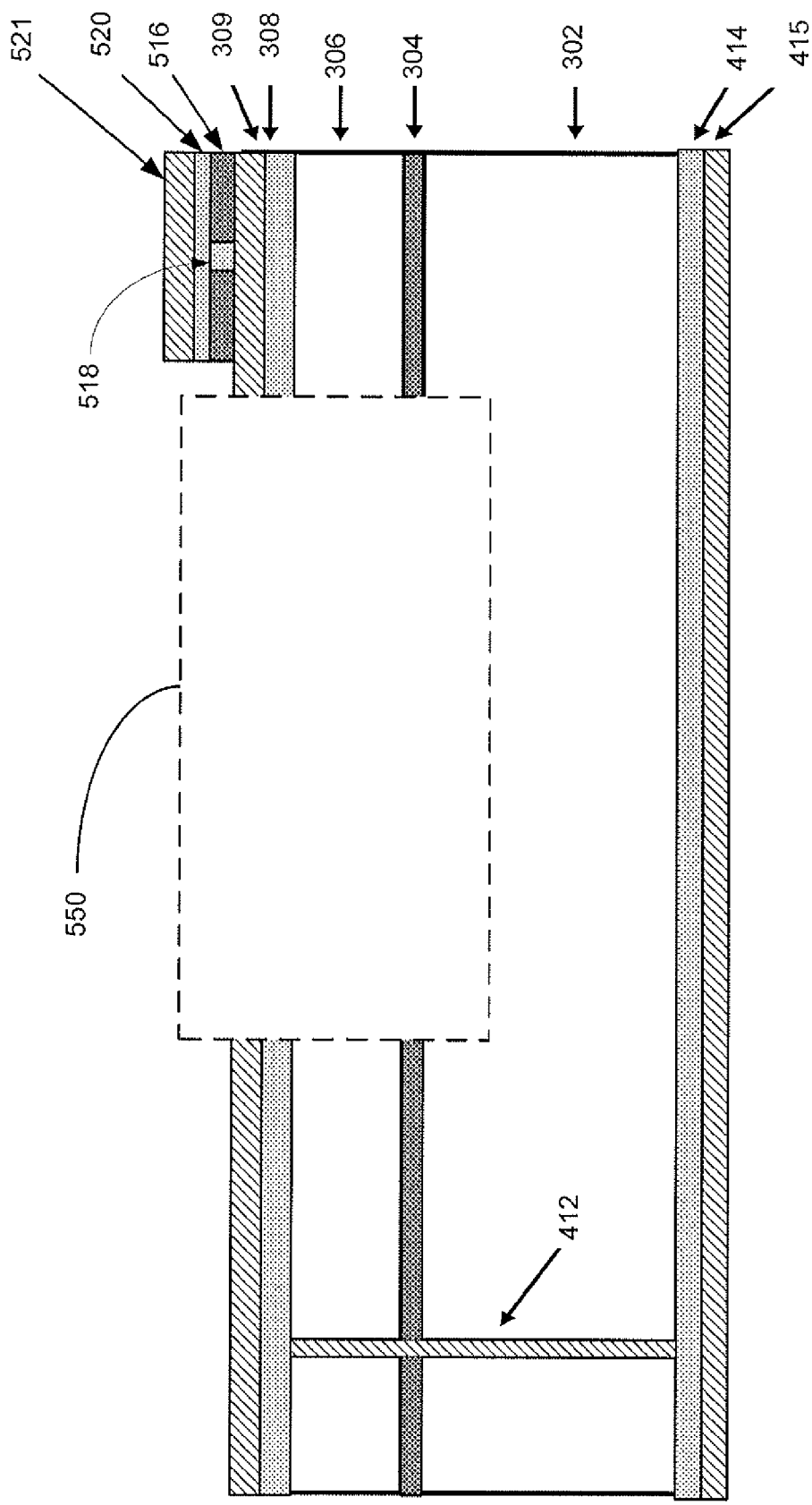
FIG. 5 shows a cross-section of another filter device in accordance with another embodiment of the invention.

FIG. 5 shows a cross-section of a filter device 500 in accordance with another embodiment of the invention. Similar to devices 200 and 400, device 500 includes at least one base layer 302, at least one release layer 304 formed on base layer 302, at least one structural layer 306 formed on release layer 304, and conductive layers 308, 309 formed on structural layer 306.

Filter device 500 includes MEMS device portion 550, which includes the structure of one or more devices substantially similar to device 200, as described above. Accordingly, the description of the operation and manufacture of device 200 above with respect to FIGS. 2 and 3A-3C and is sufficient for purposes of describing layers 302-309 in FIG. 5 and the operation and manufacture of devices in device portion 550.

In some embodiments of the invention, device 500 can also include a ground plane layer formed using conductive layers 414, 415 and coupled using via 412, as described above with respect to FIG. 4. However, rather than provided shorted stub inductor elements, discrete inductor elements can be provided using one or more additional layers formed above layers 302-309. Such discrete elements can be formed, for example, prior to device portion 550 being formed. In such embodiments, after layers 302-309 (and layers 414, 415 and via 412, if present) are formed, additional device layers are deposited on conductive layer 309 and are used to form the discrete inductor devices.

In one exemplary process, at least one electrically non-conductive layer 516 is first formed on electrically conductive layer 309 to provide electrical isolation between the discrete inductor elements and conductive layers 308. Second, to provide electrical coupling to the device portion 550, one or more vias 518 are formed in non-conductive layer 516. The vias 518 can be formed using any conventional masking and etching techniques. Afterwards, electrically conductive layers 520 and 521 can be formed on non-conductive layer 516 and over vias 518. The conductive layers 520 can comprise one or more adhesion layers and conductive layers 521 comprise one or more metal layers 521. However, the adhesion layers 520 can be omitted in some embodiments. The conductive layers can then be patterned, using conventional masking, etching, and/or planarization techniques, to form the elements for the discrete inductors. In some embodiments, the discrete inductors can be planar inductors, such as spiral-shaped or meander/serpentine-shaped inductors. However, the various embodiments of the invention are not limited in this regard. In other embodiments, additional layers of conductive and non-conductive materials can be provided to form non-planar inductive elements, such as coil-type inductive components. Once such discrete inductors are formed, any exposed portions of conductive layers 520, 521 can be passivated. Afterwards, portions of non-conductive layer 516 over device portions 550 can be removed and device portions 550 can be formed, as previously described.

As described above, device 200 can be easily modified to provide various types of devices. In particular, by varying $x_{0\_REACT}$ relative to $x_{0\_DRV}$. For example, device 200 can be operated as a switch or an adjustable capacitor depending on the difference between $x_{0\_REACT}$ and $x_{0\_DRV}$, as shown in FIGS. 6 and 7, respectively.

Figure 6:
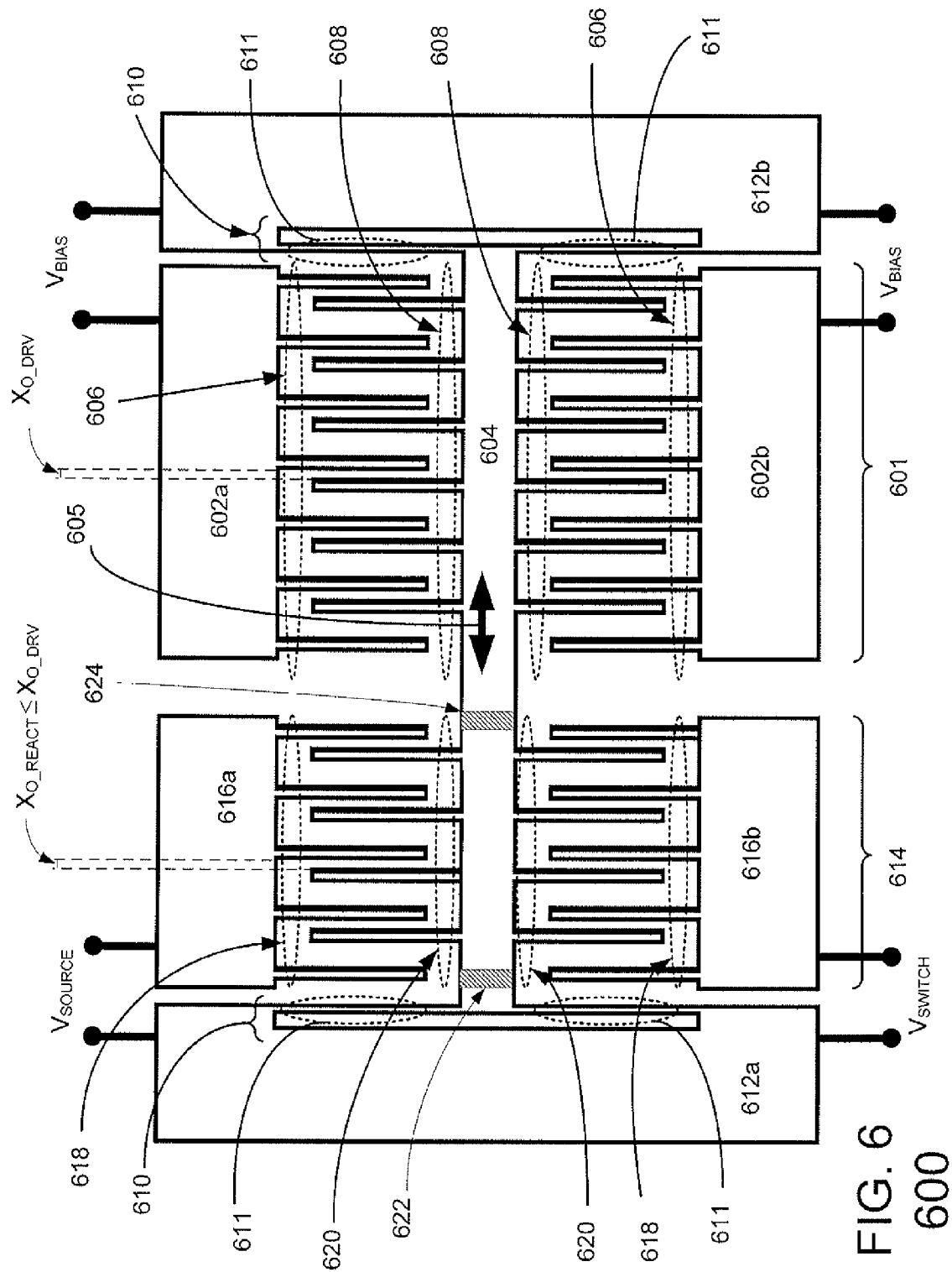
FIG. 6 shows a top-down view of an exemplary MEMS comb device adapted for use as horizontal GCA switch device for a filter bank in accordance with an embodiment of the invention.
Figure 7:
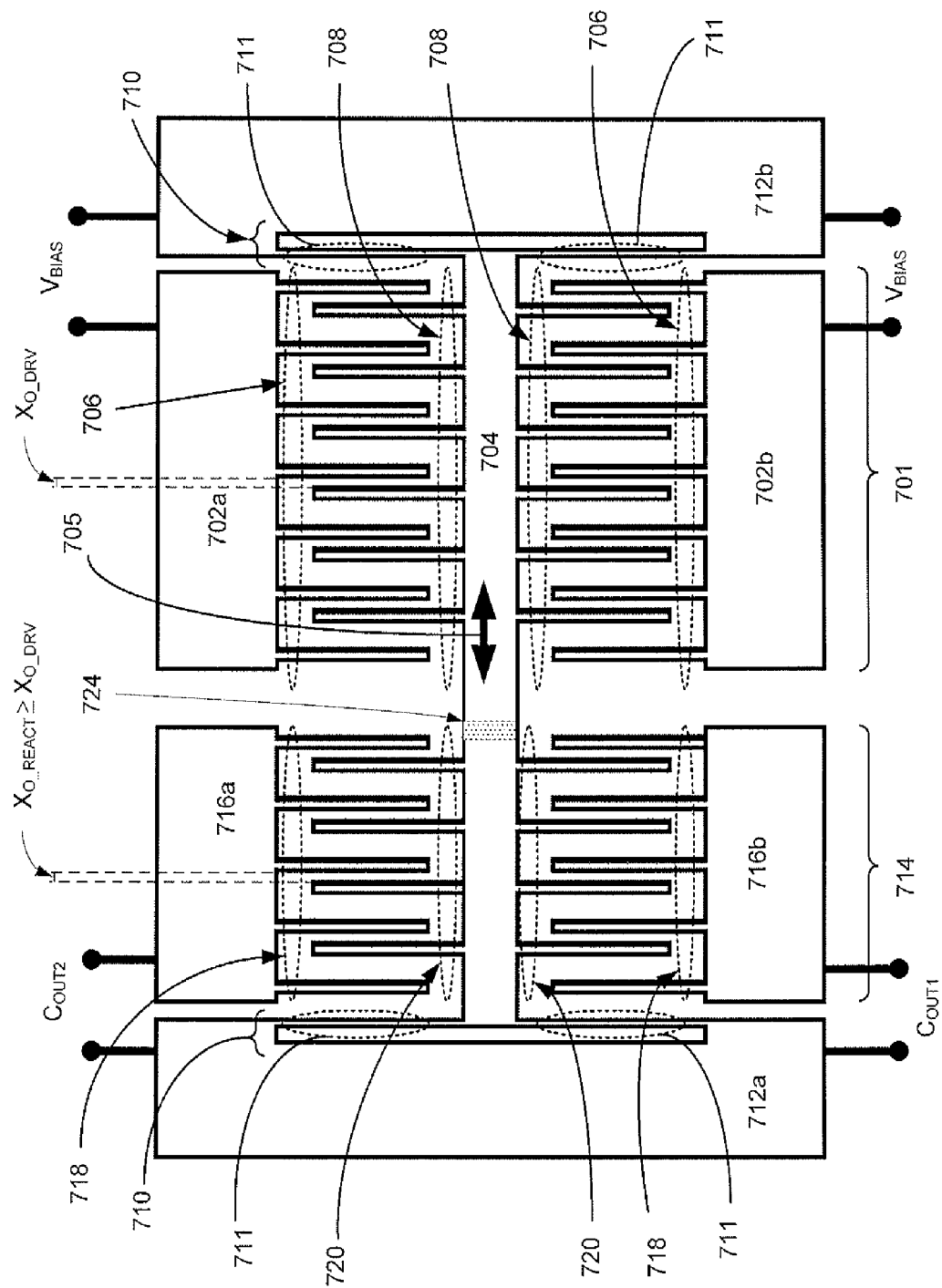
FIG. 7 shows a top-down view of an exemplary MEMS comb device adapted for use as a horizontal GCA varactor device for a filter bank in accordance with an embodiment of the invention.

FIG. 6 shows a top-down view of an exemplary MEMS comb device 600 adapted for use as horizontal GCA switch device for a filter bank in accordance with an embodiment of the invention. Similar to device 200, device 600 includes a drive portion 601, a reactive portion 614, and other components, similar to device 200 in FIG. 2. Therefore, the description above for components 201-220 is sufficient for describing the general operation of components 601-620 in FIG. 6.

As described above, device 600 is configured for operating as a switch without significant changes in design, manufacture, and operation principles. That is, the truss comb structure 604 is configured to electrically couple a first input/output comb structure 616a to a second input/output comb structure 616b. This can be accomplished by providing a configuration of the finger spacing between fingers 618 and 620 such that when the finger spacing between fingers 606 and 608 is reduced, fingers 618 and 620 come into contact to close the switch and to allow current to flow between input comb 616a and output comb 616b. In other words, a switch is provided when $x_{0\_REACT} \leq x_{0\_DRV}$. As a result, the gap between fingers 620 and 618 is closed when truss comb structure 604 moves at least a minimum amount due to a voltage difference with respect to drive comb structure 602.

In addition to dimensioning the drive comb structure 601 and the input/output comb structures 616 to allow contact of fingers 618 and 620, additional modifications of device 200 in FIG. 2 may be needed to operate device 600 as a switch. For example, as shown in FIG. 6, the input signal can be a voltage provided by a voltage source ($V_{SOURCE}$), thus requiring two input ports for the signal and the reference (e.g., ground). In device 600, this is provided by connecting the reference to fixed end 612a of truss comb structure 604 and connecting the input signal to input comb 616a. The output voltage of the switch ($V_{SWITCH}$) can then be measured by measuring the voltage difference between output comb 616b and fixed end 612a.

As described above, the MEMS structures described above comprise electrically conductive layers supported by electrically non-conductive layers. Therefore, for device 600 to operate properly as a switch, some discontinuities in the conductive layer may be required for several reasons. First, if a voltage difference develops between fingers 618 and 620, the truss comb structure 604 will also be subject to motion due to the electrostatic force generated between fingers 618 and 620. Second, when fingers 618 and 620 are brought into contact, the signal at input/output comb 616a needs to reach input/output comb 616b without being shorted to ground or some other reference point, such as fixed end 612a. Finally, when fingers 618 and 620 are brought into contact, the signal at input/output comb 616a, the signal at input/output comb 616a should not interfere with the operation of drive portion 601. In particular, the voltage difference between fingers 606 and 608 should be only controlled by a voltage difference applied directed to fingers 606 and 608 and not be affected by the voltage at the input/output combs 616.

Therefore, to avoid such issues in device 600, the electrically conductive layer on or in truss comb structure 604 can be configured to have discontinuities, such as discontinuities 622 and 624. The discontinuities 622 and 624 electrically isolate fixed end 612a, fingers 620, and fingers 608 in truss comb structure 604. Accordingly, no electrostatic force between fingers 618 and 620 is generated since the voltage at fingers 620 remains floating until fingers 620 and 618 come into contact. Furthermore, the voltage difference between input/output comb structures 616 is maintained even after fingers 620 and 618 come into contact. Additionally, the voltage at fingers 620 will not affect the voltage at fingers 608 and therefore not interfere with operation of drive portion 601.

Device 600 operates as follows. An input signal, such as $V_{SOURCE}$, is applied between input comb 616a and fixed end 612a. To close the switch, a voltage difference is developed between fingers 606 and 608. For example, a voltage $V_{BIAS}$ is applied between drive comb structures 602 (which are electrically coupled to fingers 606) and fixed end 612b (which is electrically coupled to fingers 608). The amount of $V_{BIAS}$ is selected to cause motion of truss comb structure 604 along motion axis 605 that is sufficient to move fingers 620 into contact with fingers 618, thus closing the switch. For example, $V_{BIAS}$ is selected to create and electrostatic force greater than the restorative force of reed structures 611. Afterwards, to open the switch, $V_{BIAS}$ is reduced such that the electrostatic force is less than the restoring force applied by reed structures 611. The restoring force then acts on truss comb structure 604 to separate fingers 620 from fingers 618 and opens the switch.

As described above, the device 200 can also be configured to provide functionality as another type of device, such as an adjustable capacitor or varactor, also without significant changes in design, manufacture, and operation principles. This is illustrated below with respect to FIG. 7. FIG. 7 shows a top-down view of an exemplary MEMS comb device 700 adapted for use as a horizontal GCA varactor device for a filter bank in accordance with an embodiment of the invention. As described above, device 700 includes a drive portion 701, a reactive portion 714, and other components, similar to in FIG. 2. Therefore, the description above for components 201-220 is sufficient for describing the general operation of components 701-720 in FIG. 7.

As described above, device 700 is configured for operating as a varactor. In particular, the truss comb structure 704 is configured to provide an adjustable capacitor based on adjustment of the gap between a first capacitor plate, provided by fingers 718, and a second capacitor plate, provided by fingers 720. Therefore, device 700 forms a first capacitor between comb structure 716a and truss comb structure 704, with a capacitance of $C_{OUT1}$, and a second capacitor between comb structure 716b and truss comb structure 704, with a capacitance of $C_{OUT2}$.

As described above, device 700 is configured for operating as a varactor without significant changes in design, manufacture, and operation principles. That is, the truss comb structure 704 is configured to adjust the finger spacing between fingers 718 and 720 as the finger spacing between fingers 706 and 708 is reduced. However, to maintain proper operation of the varactor, the fingers 718 and 720 should not come into contact to allow current to flow between comb structure 716a and comb structure 716b. Therefore, in the various embodiments of the invention, $x_{0\_REACT} \gtreqqless x_{0\_DRV}$ in a varactor device to ensure that even if fingers 706 and 708 come into contact, a gap is maintained between fingers 720 and 718.

In the various embodiments of the invention, these first and second capacitors can be connected in various ways to provide capacitances in series or parallel. For example, to provide a series capacitance, the capacitance can be measured between comb structures 716a and 716b. In contrast to provide a parallel capacitance, the capacitence can be measured between comb structures 716a, 716b and fixed end 712a (if electrically coupled to fingers 720).

In some embodiments of the invention, a discontinuity 724 is provided to isolate fingers 720 from fingers 708. As described above, the discontinuity 724 can be provided to reduce any interference between the reactive portion 714 and the drive portion 701. For example, to prevent the charge stored between fingers 718 and 720 from affecting a voltage difference between fingers 706 and 708 and vice versa. However, if fixed ends 712a and 712b are both coupled to ground, isolation between drive portion 701 and reactive portion 714 is maintained without requiring such discontinuity 724.

Device 700 operates as follows. A circuit (not shown) is coupled to comb structures 716a, 716b, and fixed end 712a (if necessary, as described above). To increase amount of capacitance, a voltage difference ($V_{BIAS}$) is developed between fingers 706 and 708 to generate electrostatic attraction between these fingers. For example, $V_{BIAS}$ is applied across drive comb structures 702 and fixed end 712b (which is electrically coupled to fingers 708) to cause sufficient electrostatic attraction between fingers 706 and 708 to induce motion of truss comb structure 704, and consequently motion of fingers 720 towards fingers 718. The magnitude of $V_{BIAS}$ is selected to provide a gap associated with a spacing between fingers 718 and 720, and consequently capacitance value. For example, to increase capacitance, $V_{BIAS}$ is selected to create an electrostatic force that is at least greater than the restorative force of reed structures 711 to cause motion of truss comb structure 704 along motion axis 705. Afterwards, to decrease the capacitance, $V_{BIAS}$ is reduced such that the electrostatic force is less than the restoring force applied by reed structures 711. The restoring force then acts on truss comb structure 704 to increase the gap between fingers 720 from fingers 718, and thus lower the capacitance.

In the various embodiments of the invention, the switch configuration in FIG. 6 and the capacitor configuration in FIG. 7 can be used to fabricate filter banks operable over a wide range of frequency can be fabricated with a fewer number of components, as compared to conventional filter banks. For example, such components can be used to create n-order T form filters, n-order π-form filters, capacitively coupled series filters, and various other types of filters that are tunable over a wide range of frequencies. An exemplary filter and results are shown in FIGS. 8-9.

Figure 8:
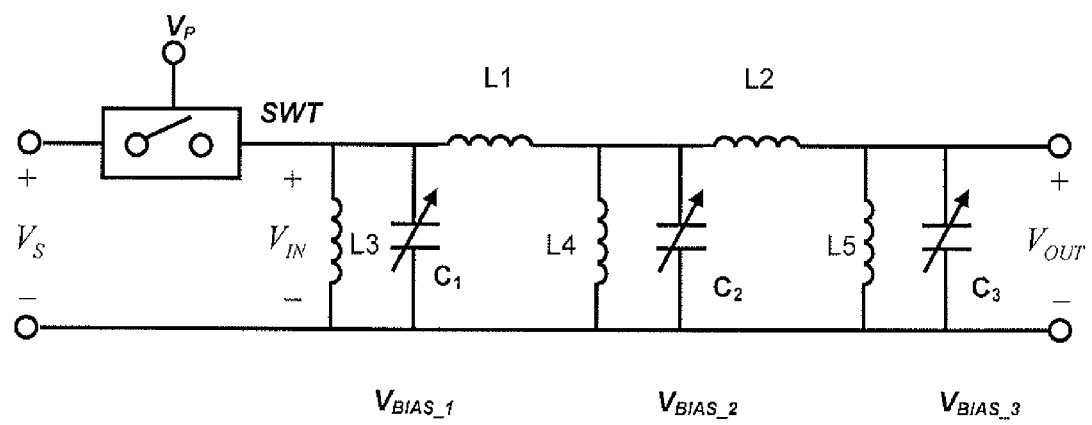
FIG. 8 is a schematic of a $3^{rd}$-order $\pi$-form band pass filter that can be realized using the various embodiments of the invention.
Figure 9:
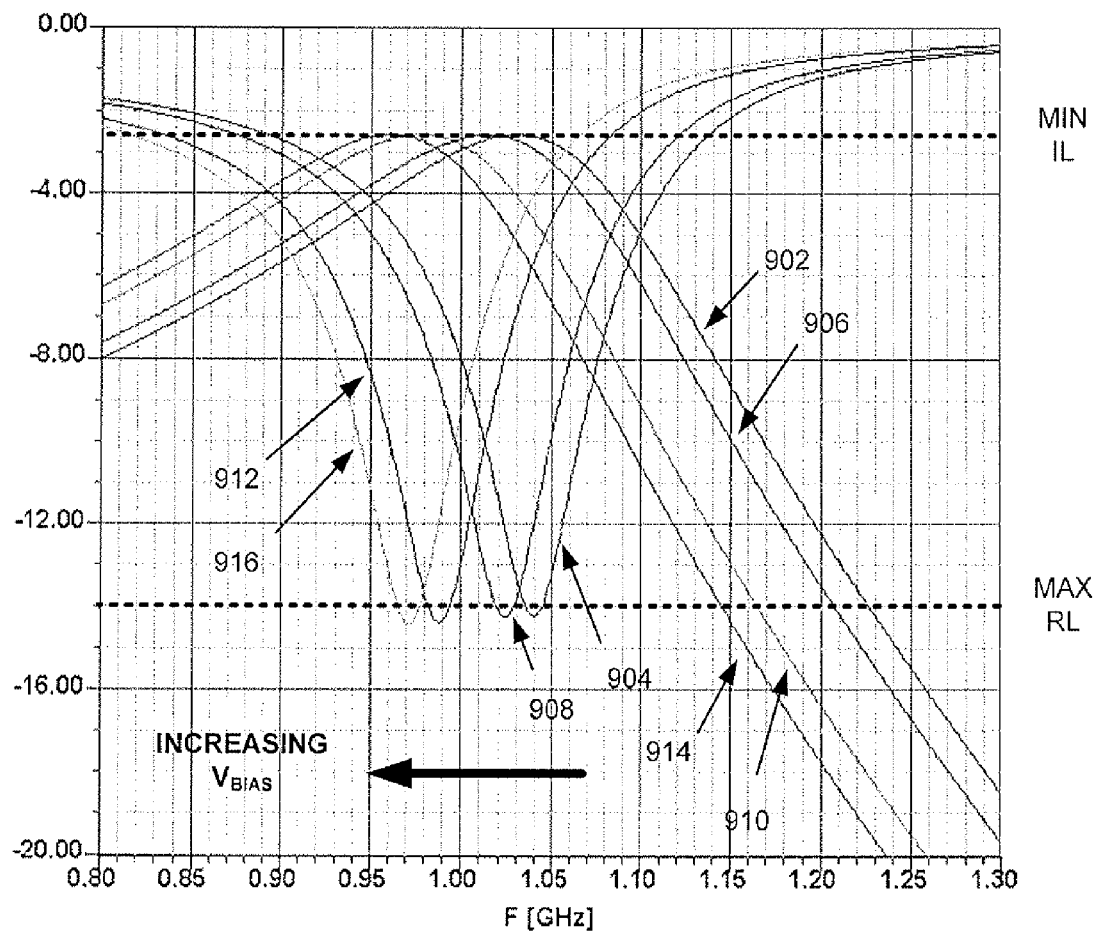
FIG. 9 is an x-y log plot of simulated insertion loss (IL) and return loss (RL) as a function of $V_{BIAS}$ for a filter configured in accordance with FIG. 8.

FIG. 8 is a schematic of a $3^{rd}$-order π-form band pass filter 800, including switch SWT and parallel voltage controlled capacitances $C_1$, $C_2$, and $C_3$ and various inductive elements (L1-L5). In general, the frequency response of filter 800, (i.e., the center frequency, $f_C$) is dependent on values of voltage-controlled capacitances $C_1$, $C_2$, and $C_3$, which are based on bias voltages $V_{BIAS\_1}$, $V_{BIAS\_2}$, and $V_{BIAS\_3}$. In some embodiments of the invention, $V_{BIAS\_1}$, $V_{BIAS\_2}$, and $V_{BIAS\_3}$ are controlled separately. However, in other embodiments of the invention, bias voltages $V_{BIAS\_1}$, $V_{BIAS\_2}$, and $V_{BIAS\_3}$ are controlled using a same signal. Such a configuration permits a reduction of the number of components needed. In either case, based on bias voltages $V_{BIAS\_1}$, $V_{BIAS\_2}$, and $V_{BIAS\_3}$ and values for capacitances $C_1$, $C_2$, and $C_3$, the filter 800 is selectably adjustable to provide a band pass filter operable over a range of frequencies.

Although several methods exist for constructing filters with such a design of capacitors, the various embodiments of the invention provide a relatively simpler and more reliable method for providing filters, such as that illustrated in FIG. 8. For example, the filter in FIG. 8 can be realized using a horizontal GCA switch device, such as device 600 in FIG. 6, three horizontal GCA capacitor devices, such as device 700 in FIG. 7. The inductive elements for filter 800 can be provided using shorted stub inductors or discrete inductors, as described above in FIGS. 4 and 5, respectively.

In some embodiments of the invention, the horizontal GCA capacitor devices used to realize filter 800 are identically configured. That is, the device can have the same finger spacing in the reactive portion to provide identical capacitors coupled in parallel. However, the invention is not limited in this regard. In other embodiments of the invention, different finger spacing for the fingers in the reactive portion are provided. The spacing for each of the horizontal GCA capacitors can be selected in order to provide an appropriate frequency response.

FIG. 9 is an x-y log plot 900 of simulated insertion loss (IL) and return loss (RL) as a function of $V_{BIAS}$ for a filter configured in accordance with FIG. 8. For purposes of simulation, the horizontal GCA capacitors were identically configured. In particular, the horizontal GCA capacitors were designed to have $x_o$=10 um and $y_o$=25 um. The spring constant (k) for the structure was selected to be 103.125 N/m. The inductor values were selected to be L1=L2=28 nH and L3=L4=L5=14 nH.

In the simulation, $V_{BIAS}$ values of 0V, 46V, 57V, and 61V were applied. At $V_{BIAS}$=0V, IL curve 902 and RL curve 904 were generated. At $V_{BIAS}$=46V, a motion of 0 um was generated, resulting in IL curve 906 and RL curve 908. At $V_{BIAS}$=57V, a motion of 2 um was generated, resulting in IL curve 910 and RL curve 912. At $V_{BIAS}$=61V, a motion of 3 um was generated, resulting in IL curve 914 and RL curve 916.

In the various embodiments of the invention, the pass band for a filter can have values of IL approaching 1 dB and values of RL that are maximized. For example, in the simulated data shown in FIG. 9, IL is approximately 2.5 dB and RL is approximately 14 dB. Therefore, if a pass band for a band pass filter is adjusted, the frequencies associated with the minimum values of IL and the maximum values of RL shift would shift. This type of frequency response is provided by the various embodiments of the invention, as illustrated in FIG. 9. FIG. 9 shows that as $V_{BIAS}$ is increased, minimum values of IL and the maximum values of RL shift in frequency. In particular, the frequencies shift downwards, as shown by the concurrent shift of IL curves 906, 910, and 914 as compared to IL curve 902 and RL curves 908, 912, and 916 as compared to RL curve 904. Accordingly, the center frequency in FIG. 9 is shifted approximately 70 MHz.

In some cases, a shift of <100 MHz may be insufficient for some applications. However, a greater range of motion (i.e., a greater range of capacitances) is effectively limited by snap-in effects. That is, after a threshold bias voltage level, the electrostatic attraction in the drive portion increases to a degree that the fingers in the drive comb and the truss comb are forced (i.e. "snap-in") together. Accordingly, further control of the horizontal GCA capacitor to obtain higher capacitances (i.e., smaller x values) is not possible. In general, a horizontal GCA capacitor will snap-in at a position less than that of a two-plate, parallel plate ideal GCA capacitor. This position can be $\frac{2}{3}x_o$ or greater. However, in some embodiments of the invention, this limitation can be overcome by adding a capacitor in series between a drive comb and the voltage source supplying $V_{BIAS}$. This configuration is shown in FIG. 10.

Figure 10:
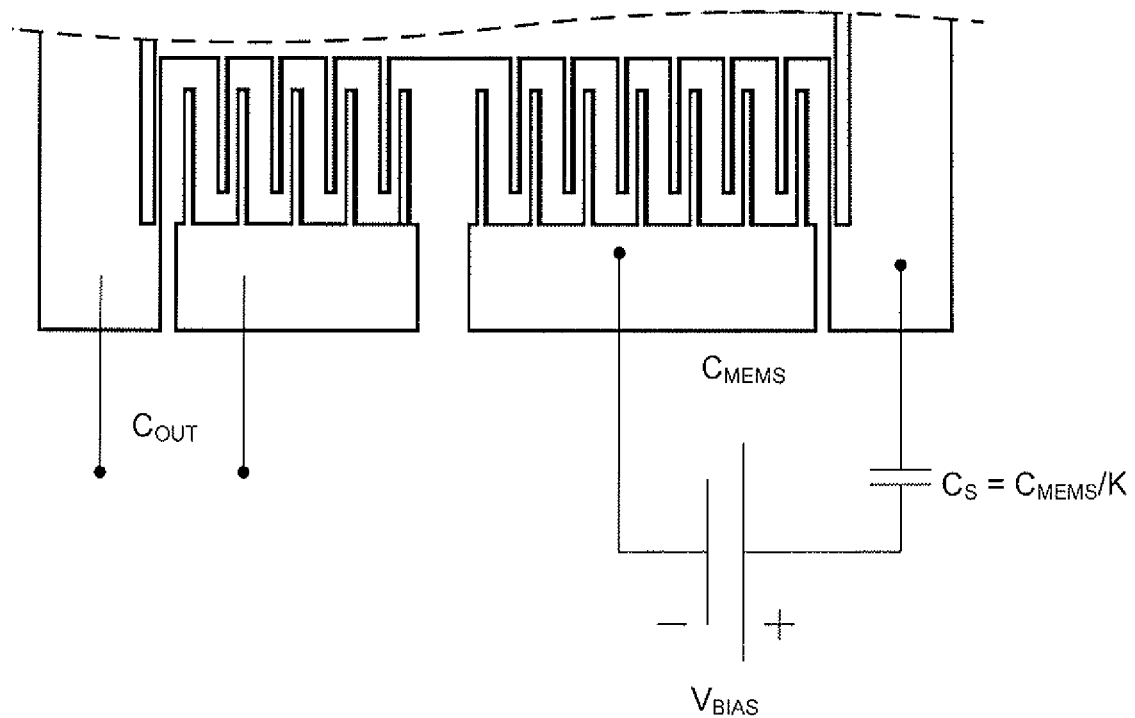
FIG. 10 shows a portion of a horizontal GCA capacitor operating in accordance with an alternate embodiment of the invention.

FIG. 10 shows a portion of a horizontal GCA capacitor 1000 operating in accordance with an alternate embodiment of the invention. The configuration shown in FIG. 10 is similar to that shown in FIG. 7. As shown in FIG. 10 a fixed capacitor (Cs) is provided in series with the source of $V_{BIAS}$. In the configuration of FIG. 10, the value of Cs and $C_{MEMS}$ (the capacitance of the drive portion of horizontal GCA capacitor at VBIAS=0) can be related by Cs=$C_{MEMS}$/K, where K>0. As a result of this configuration, a snap-in position of less than $\frac{2}{3}x_o$ can be obtained. This is shown in FIG. 11.

Figure 11:
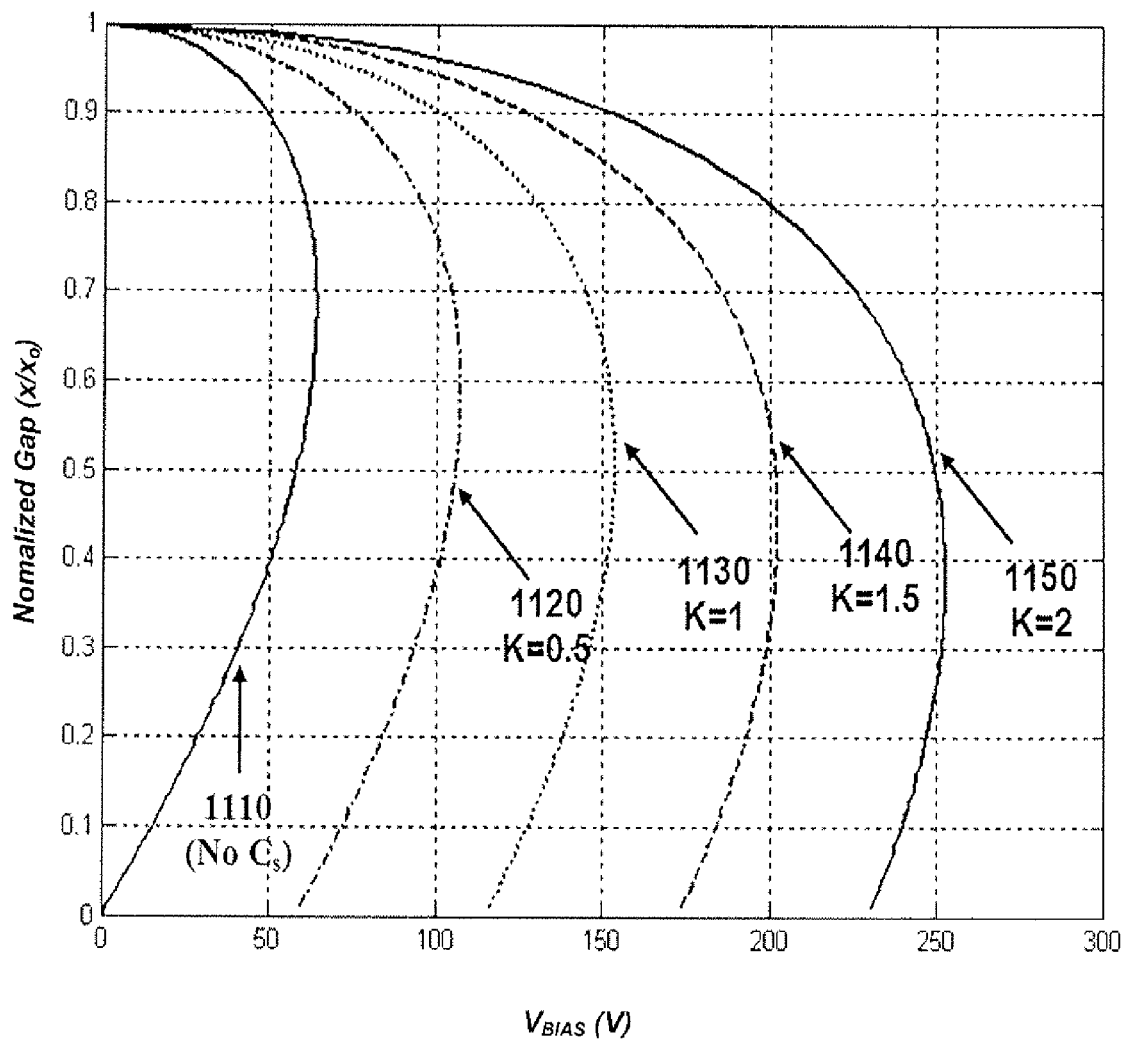
FIG. 11 is an x-y plot 11 of simulated normalized gap value $(x/x_o)$ curves as a function of $V_{BIAS}$ for horizontal GCA capacitors with and without a series capacitance in accordance with an embodiment of the invention.

FIG. 11 is an x-y plot 11 of simulated normalized gap value ($x/x_o$) curves as a function of $V_{BIAS}$ for horizontal GCA capacitors with and without Cs. For the simulation in FIG. 11, $x_o$ was 10 um, $y_o$ was 25 um, and the spring constant or stiffness (k) was 103.125 N/m. In FIG. 11, curve 1110, the output of a horizontal GCA capacitor without capacitor Cs, shows that the snap-in position (the normalized gap associated with a peak VBIAS for a curve) occurs at a normalized gap value of approximately $\frac{2}{3}x_o$, as described above. However, the addition of Cs increases the snap-in position. For example, as shown in curves 1120, 1130, 1140, 1150, where K equals 0.5, 1, 1.5, and 2, respectively, the snap-in position is reduced by the addition of Cs. Furthermore, as K is increased, the snap-in position is further reduced. For example, in curve 1150 (K=2) the snap-in position is associated with a normalized gap value of less than $0.4x_o$. In contrast, in curve 1120, the snap-in position is associated with a normalized gap value of approximately $0.6x_o$.

As shown in FIG. 11, one result of providing a capacitor Cs is that higher $V_{BIAS}$ values are needed to actuate the horizontal GCA capacitor. Therefore, in some embodiments of the invention, the stiffness (k) of the reed structures can be reduced to compensate the higher $V_{BIAS}$ values. However, this can make the horizontal GCA capacitors more susceptible to external acceleration forces. Accordingly, in some embodiments of the invention the values for K and k can be selected to minimize issues and enhance performance for a particular application.

Figure 12:
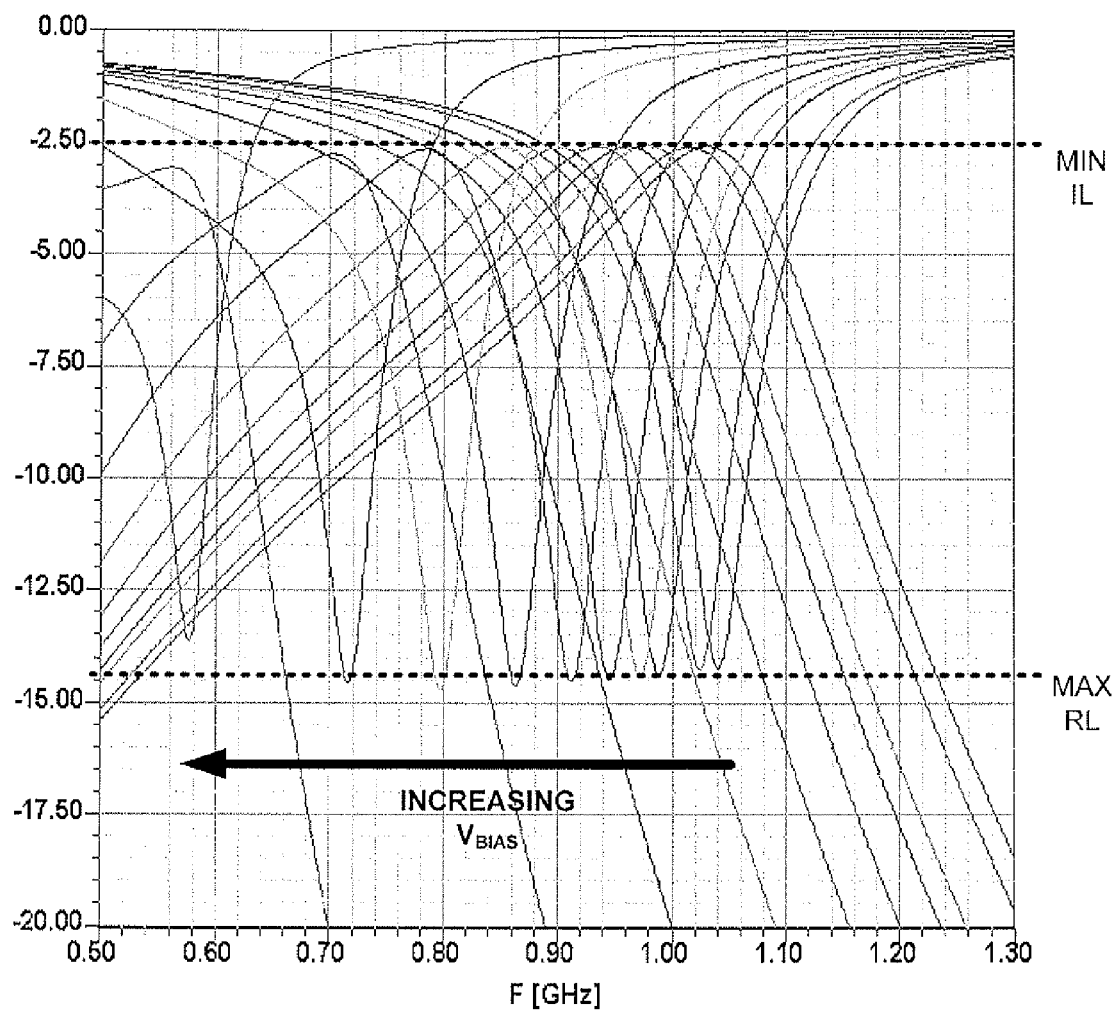
FIG. 12 is an x-y log plot of simulated insertion loss (IL) and return loss (RL) as a function of $V_{BIAS}$ for a filter configured in accordance with FIGS. 8 and 10.

FIG. 12 is an x-y log plot 1200 of simulated insertion loss (IL) and return loss (RL) as a function of $V_{BIAS}$ for a filter configured in accordance with FIGS. 8 and 10. For purposes of simulation, the horizontal GCA capacitors were identically configured. In particular, the horizontal GCA capacitors were designed to have $x_o$=10 um and $y_o$=25 um. The spring constant (k) for the structure was selected to be 103.125 N/m. The inductor values were selected to be L1=L2=28 nH and L3=L4=L5=14 nH. K was selected to be equal to 6 (i.e., 6*Cs=$C_{MEMS}$). In the simulation, $V_{BIAS}$ values between 0V and 93V were applied. As shown in FIG. 12, as $V_{BIAS}$ is increased, the center frequency was shifted from 1.04 GHz to 580 MHz, providing a 460 MHz shift in center frequency. Thus the frequency range for the filter was significantly increased with the addition of 3 fixed capacitors without significant degradation in RL or IL values at the center frequencies.

Figure 13:
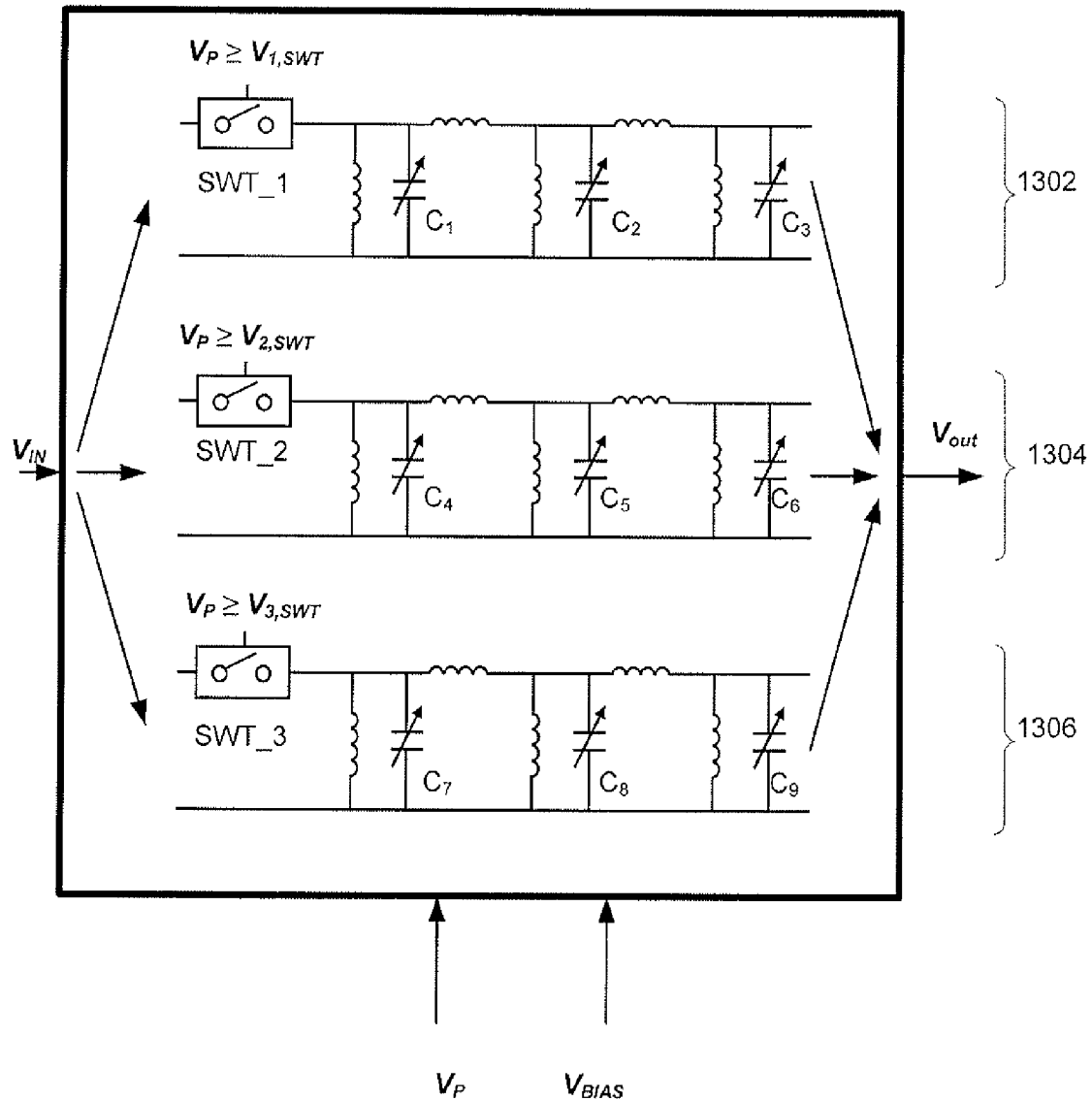
FIG. 13 is a schematic of a filter bank that can be realized using the various embodiments of the invention.

Using such filter designs, a filter bank can be designed and manufactured with a reduced number of components and which is simpler in design and manufacturing complexity as compared to convention filter banks. For example, FIG. 13 is a schematic of a filter bank 1300 that can be realized using the various embodiments of the invention. Filter bank 1300 includes filters 1302, 1304, and 1306 configured for filtering an input signal ($V_{IN}$) and generating an output signal ($V_{OUT}$). Each of filters 1302, 1304, and 1306 is realized as described above with respect to FIG. 8. That is, each filter includes a horizontal GCA switch device, such as device 600 in FIG. 6, and one or more horizontal GCA capacitor devices, such as device 700 in FIG. 7. The inductive elements for filters 1302-1306 can be provided using shorted stub inductors or discrete inductors, as described above in FIGS. 4 and 5, respectively. In each of the horizontal GCA capacitor devices used to realize filter 1300, different finger spacing for the fingers in the reactive portion can be selected to provide a difference range of capacitances for each horizontal GCA capacitor devices.

Although a wide range of frequencies could be filtered using a single filter, a bank of multiple filters allows for a greater amount of control and/or a wider range of frequencies with better IL and RL characteristics. In some embodiments of the invention, to provide switching between different portions of a filter bank using GCA devices in accordance with an embodiment of the invention, either a control logic is used with control signals to select one of the filters or each filter has a separate control signal. In other embodiments of the invention, the filter bank can be operated without such a control system. For example, similar to providing different ranges of capacitance, the switches SWT_1-SWT_3 can also be selected to have different finger spacing in the reactive portions. As a result, activation of switches SWT_1-SWT_3 can be controlled using a single signal $V_P$, where the activation is based on a magnitude of $V_P$. In the various embodiments of the invention, such a configuration can be realized by providing electrical interconnects to couple together the drive comb structures of the switches.

Although this configuration means that more than one of switches SWT_1-SWT_3 may be closed at any one time, the capacitances C1-C9 can be selected such that the overall frequency response is unaffected by such multiple switch actuations. For example, even if the magnitude of $V_P$ is sufficient to activate both SWT_1 and SWT_2, by selecting the magnitudes of the capacitances C4-C6 to be substantially larger than those of C1-C3 (e.g., by an order of magnitude), the parallel combination of C4-C6 and C1-C3 results in a total capacitance that is dominated by C4-C6. As a result, the frequency response of filter bank 1300 will remain largely unaffected due to the presence of C1-C3. Therefore, filter bank 1300 can be operated with a substantially few number of control signals. Principally, these include a single $V_P$ for activating SWT_1-SWT_3 and a single $V_{BIAS}$ for adjusting the capacitances C1-C9 to adjust the center frequency of the filter.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A filter device, comprising:
 a substrate;
 a plurality of horizontal gap closing actuator (GCA) devices disposed on a first surface of said substrate, said plurality of GCA devices comprising one or more GCA varactors,
 wherein each one of said plurality of horizontal GCA devices comprises at least one drive comb structure, at least one input/output (I/O) comb structure, and at least one truss comb structure interdigitating said drive comb and said I/O comb structures, said truss comb structure configured to move along a motion axis between a first interdigitated position and at least a second interdigitated position based on a bias voltage applied between said truss comb structure and said drive comb structure;
 wherein an interdigital spacing between said truss comb structure and each of said I/O comb structure and said drive comb structure is approximately the same in at least a first one of said horizontal GCA devices in which said I/O comb structure is configured as part of a varactor, and is different in at least a second one of said horizontal GCA devices to facilitate electrical contact between said I/O comb structure and said truss comb structure, whereby said second one of said horizontal GCA devices is configured to function as a switch; and
 wherein at least said first one of said horizontal GCA devices comprises a stopper configured to limit an amount of motion of said truss comb structure and prevent at least said interdigital spacing between said truss comb structure and said I/O comb structure from going to zero.

2. The device of claim 1, wherein said plurality of horizontal GCA devices are coupled to at least one inductive element formed on said substrate.

3. The device of claim 2, wherein said inductive element comprises:
 at least a first electrically conductive element disposed on said first surface of said substrate;
 at least a second electrically conductive element disposed on said first surface of said substrate; and at least one electrically conductive via extending through said substrate and shorting said first and said second electrically conductive elements to ground.

4. The device of claim 1, wherein said plurality of horizontal GCA devices are coupled to at least one planar inductive element disposed on said first surface.

5. The device of claim 1, wherein said plurality of horizontal GCA devices are coupled to provide one among a T-type filter, a π-type filter, and a capacitively coupled series filter.

6. The device of claim 1, wherein each one of said plurality of horizontal GCA devices further comprises at least one fixed end structure and one or more reed structures for springingly coupling said truss comb structure to said fixed end structure.

7. The device of claim 1, wherein said first and said second interdigitated positions in at least a first and a second of said GCA varactors are different.

8. A filter device, comprising:
a substrate;
a plurality of horizontal gap closing actuator (GCA) devices disposed on a first surface of said substrate, said plurality of GCA devices comprising one or more GCA varactors;
at least one electrically conductive via extending through said substrate and electrically coupled to at least a portion of said plurality of horizontal GCA devices; and
at least one electrically conductive ground plane layer disposed on a bottom surface of said substrate, said ground plane layer electrically coupled to said electrically conductive via;
wherein each one of said plurality of horizontal GCA devices comprises at least one drive comb structure, at least one input/output (I/O) comb structure, and at least one truss comb structure interdigitating said drive comb and said I/O comb structures, said truss comb structure configured to move along a motion axis between a first interdigitated position and at least a second interdigitated position based on a bias voltage applied between said truss comb structure and said drive comb structure.

9. A filter device, comprising:
a substrate;
a plurality of horizontal gap closing actuator (GCA) devices disposed on a first surface of said substrate, said plurality of GCA devices comprising one or more GCA varactors;
a plurality of fixed capacitive elements, each one of said plurality of fixed capacitive elements electrically coupled in series with one of said GCA varactors and having a capacitance value less than a lowest capacitance value of said associated one of said GCA varactors;
wherein each one of said plurality of horizontal GCA devices comprises at least one drive comb structure, at least one input/output (I/O) comb structure, and at least one truss comb structure interdigitating said drive comb and said I/O comb structures, said truss comb structure configured to move along a motion axis between a first interdigitated position and at least a second interdigitated position based on a bias voltage applied between said truss comb structure and said drive comb structure.

10. A filter bank, comprising:
a substrate;
one or more filter elements coupled to a common input node and a common output node, each of said filter elements comprising a plurality of horizontal gap closing actuator (GCA) devices disposed on a first surface of said substrate, said plurality of GCA devices comprising one or more GCA varactors,
wherein each one of said plurality of horizontal GCA devices comprises at least one drive comb structure, at least one input/output (I/O) comb structure, and at least one truss comb structure interdigitating said drive comb and said I/O comb structures, said truss comb structure configured to move along a motion axis between at least a first interdigitated position and a second interdigitated position based on a bias voltage applied between said truss comb structure and said drive comb structure;
wherein an interdigital spacing between said truss comb structure and each of said I/O comb structure and said drive comb structure is approximately the same in at least a first one of said horizontal GCA devices in which said I/O comb structure is configured as part of a varactor, and is different in at least a second one of said horizontal GCA devices to facilitate electrical contact between said I/O comb structure and said truss comb structure, whereby said second one of said horizontal GCA devices is configured to function as a switch; and
wherein at least said first one of said horizontal GCA devices comprises a stopper configured to limit an amount of motion of said truss comb structure and prevent at least said interdigital spacing between said truss comb structure and said I/O comb structure from going to zero.

11. The filter bank of claim 10, wherein at least one of said plurality of horizontal GCA devices is coupled to at least one inductive element disposed on said substrate.

12. The filter bank of claim 10, wherein each one of said plurality of horizontal GCA devices further comprises at least one fixed end structure and one or more reed structures for springingly coupling said truss comb structure to said fixed end structure.

13. A filter bank, comprising:
a substrate;
one or more filter elements coupled to a common input node and a common output node, each of said filter elements comprising a plurality of horizontal gap closing actuator (GCA) devices disposed on a first surface of said substrate, said plurality of GCA devices comprising one or more GCA varactors and at least one GCA switch;
a first common control node coupled to said GCA switch in at least two of said filter elements;
wherein each one of said plurality of horizontal GCA devices comprises at least one drive comb structure, at least one input/output (I/O) comb structure, and at least one truss comb structure interdigitating said drive comb and said I/O comb structures, said truss comb structure configured to move along a motion axis between at least a first interdigitated position and a second interdigitated position based on a bias voltage applied between said truss comb structure and said drive comb structure;
wherein said first and said second interdigitated positions for said GCA switch in said two of said filter elements are different.

14. The filter bank of claim 13, further comprising:
a second common control node coupled to at least two of said GCA varactors in said filter elements, and
wherein said first and said second interdigitated positions for said at least two of said GCA varactors coupled to said second common node are different.

15. A filter bank, comprising:
a substrate;
one or more filter elements coupled to a common input node and a common output node, each of said filter elements comprising a plurality of horizontal gap closing actuator (GCA) devices disposed on a first surface of said substrate, said plurality of GCA devices comprising one or more GCA varactors; and
a plurality of fixed capacitive elements, each one of said plurality of fixed capacitive elements associated with one of said GCA varactors and having a capacitance value less than a lowest capacitance value of said associated one of said GCA varactors;
wherein each one of said plurality of horizontal GCA devices comprises at least one drive comb structure, at least one input/output (I/O) comb structure, and at least one truss comb structure interdigitating said drive comb and said I/O comb structures, said truss comb structure configured to move along a motion axis between at least a first interdigitated position and a second interdigitated position based on a bias voltage applied between said truss comb structure and said drive comb structure.

16. A method of manufacturing a filter device, comprising:
providing a substrate comprising a stack of layers, said stack comprising at least one base layer, at least one release layer on said base layer, and at least one structure layer on said release layer;
depositing at least one electrically conductive layer on said structure layer; and
forming a plurality of voids in said electrically conductive layer, said structure layer, and said release layer,
wherein said plurality of voids define a plurality of patterned regions, said plurality of patterned regions defining a plurality of horizontal gap closing actuator (GCA) devices comprising one or more GCA varactors, each of said plurality of GCA devices comprising at least one drive comb structure, at least one input/output (I/O) comb structure, and at least one truss comb structure interdigitating said drive comb and said I/O comb structures, said plurality of voids in said release layer extending beneath said truss comb structure to allow said truss comb structure to move along a motion axis between at least a first interdigitated position and a second interdigitated position.

17. A method of manufacturing a filter device, comprising:
providing a substrate comprising a stack of layers, said stack comprising at least one base layer, at least one release layer on said base layer, and at least one structure layer on said release layer;
depositing at least one electrically conductive layer on said structure layer; and
forming a plurality of voids in said electrically conductive layer, said structure layer, and said release layer;
wherein said plurality of voids define a plurality of patterned regions, said plurality of patterned regions defining a plurality of horizontal gap closing actuator (GCA) devices comprising one or more GCA varactors, each of said plurality of GCA devices comprising at least one drive comb structure, at least one input/output (I/O) comb structure, and at least one truss comb structure interdigitating said drive comb and said I/O comb structures, said plurality of voids in said release layer extending beneath said truss comb structure to allow said truss comb structure to move along a motion axis between at least a first interdigitated position and a second interdigitated position; and
wherein said forming further comprises selecting said plurality of voids to further define for each one of said plurality of horizontal GCA devices at least one fixed end structure and one or more reed structures for springingly coupling to said truss comb structure to said fixed end structure.

18. A method of manufacturing a filter device, comprising:
providing a substrate comprising a stack of layers, said stack comprising at least one base layer, at least one release layer on said base layer, and at least one structure layer on said release layer;
depositing at least one electrically conductive layer on said structure layer; and
forming a plurality of voids in said electrically conductive layer, said structure layer, and said release layer;
wherein said plurality of voids define a plurality of patterned regions, said plurality of patterned regions defining a plurality of horizontal gap closing actuator (GCA) devices comprising one or more GCA varactors, each of said plurality of GCA devices comprising at least one drive comb structure, at least one input/output (I/O) comb structure, and at least one truss comb structure interdigitating said drive comb and said I/O comb structures, said plurality of voids in said release layer extending beneath said truss comb structure to allow said truss comb structure to move along a motion axis between at least a first interdigitated position and a second interdigitated position; and
wherein said forming further comprises selecting said plurality of voids to provide different first and said second interdigitated positions in at least a first and a second of said GCA varactors.

19. A method of manufacturing a filter device, comprising:
providing a substrate comprising a stack of layers, said stack comprising at least one base layer, at least one release layer on said base layer, and at least one structure layer on said release layer;
depositing at least one electrically conductive layer on said structure layer; and
forming a plurality of voids in said electrically conductive layer, said structure layer, and said release layer;
wherein said plurality of voids define a plurality of patterned regions, said plurality of patterned regions defining a plurality of horizontal gap closing actuator (GCA) devices comprising one or more GCA varactors, each of said plurality of GCA devices comprising at least one drive comb structure, at least one input/output (I/O) comb structure, and at least one truss comb structure interdigitating said drive comb and said I/O comb structures, said plurality of voids in said release layer extending beneath said truss comb structure to allow said truss comb structure to move along a motion axis between at least a first interdigitated position and a second interdigitated position; and
wherein said forming further comprises defining one or more GCA switches and selecting said plurality of voids to provide different first and said second interdigitated positions in at least a first and a second of said GCA switches.

20. A method of manufacturing a filter device, comprising:
providing a substrate comprising a stack of layers, said stack comprising at least one base layer, at least one release layer on said base layer, and at least one structure layer on said release layer;
depositing at least one electrically conductive layer on said structure layer;

forming a plurality of voids in said electrically conductive layer, said structure layer, and said release layer, wherein said plurality of voids define a plurality of patterned regions,
said plurality of patterned regions defining a plurality of horizontal gap closing actuator (GCA) devices comprising one or more GCA varactors,
each of said plurality of GCA devices comprising at least one drive comb structure, at least one input/output (I/O) comb structure, and at least one truss comb structure interdigitating said drive comb and said I/O comb structures,
said plurality of voids in said release layer extending beneath said truss comb structure to allow said truss comb structure to move along a motion axis between at least a first interdigitated position and a second interdigitated position; and
forming a plurality of fixed capacitive elements, each one of said plurality fixed capacitive elements associated with one of said GCA varactors and having a capacitance value less than a lowest capacitance value of said associated one of said GCA varactors.

* * * * *